(12) United States Patent
Seo et al.

(10) Patent No.: US 11,502,110 B2
(45) Date of Patent: Nov. 15, 2022

(54) DISPLAY DEVICE AND METHOD OF MANUFACTURING THE SAME

(71) Applicant: SAMSUNG DISPLAY CO., LTD., Yongin-si (KR)

(72) Inventors: Jung Yub Seo, Cheonan-si (KR); Tetsuhiro Tanaka, Hwaseong-si (KR); Hee Won Yoon, Cheonan-si (KR); Shin Beom Choi, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 101 days.

(21) Appl. No.: 17/079,608

(22) Filed: Oct. 26, 2020

(65) Prior Publication Data
US 2021/0296367 A1 Sep. 23, 2021

(30) Foreign Application Priority Data
Mar. 18, 2020 (KR) .................. 10-2020-0033339

(51) Int. Cl.
*H01L 27/12* (2006.01)
*H01L 29/786* (2006.01)
(Continued)

(52) U.S. Cl.
CPC ...... *H01L 27/1222* (2013.01); *H01L 27/1214* (2013.01); *H01L 27/1225* (2013.01);
(Continued)

(58) Field of Classification Search
CPC ............. H01L 27/1222; H01L 27/1237; H01L 27/1274; H01L 27/1255
See application file for complete search history.

(56) References Cited

U.S. PATENT DOCUMENTS

2009/0194809 A1* 8/2009 Cho ...................... H01L 29/792
257/324
2011/0127518 A1* 6/2011 Jung ................... H01L 29/7869
257/43
(Continued)

FOREIGN PATENT DOCUMENTS

JP 2009141002 6/2009
JP 2013156281 8/2013
(Continued)

*Primary Examiner* — Ahmed N Sefer
(74) *Attorney, Agent, or Firm* — F. Chau & Associates, LLC

(57) ABSTRACT

A display device includes a base substrate; an oxide semiconductor layer disposed on the base substrate; a first gate insulating layer disposed on a first channel region of the oxide semiconductor layer and that overlaps the first channel region thereof; a first upper gate electrode disposed on the first gate insulating layer; and an upper interlayer insulating layer disposed on the first upper gate electrode, the first upper gate electrode, and the oxide semiconductor layer, wherein the upper interlayer insulating layer includes a first upper interlayer insulating layer, a second upper interlayer insulating layer, and a third upper interlayer insulating layer, the first upper interlayer insulating layer includes silicon oxide, each of the second and third upper interlayer insulating layers include silicon nitride, and a hydrogen concentration in the second upper interlayer insulating layer is less than a hydrogen concentration in the third upper interlayer insulating layer.

27 Claims, 26 Drawing Sheets

(51) Int. Cl.
     *H01L 51/52*     (2006.01)
     *H01L 27/32*     (2006.01)
(52) U.S. Cl.
     CPC ...... *H01L 27/1237* (2013.01); *H01L 27/1255* (2013.01); *H01L 27/1274* (2013.01); *H01L 27/3246* (2013.01); *H01L 27/3248* (2013.01); *H01L 27/3258* (2013.01); *H01L 27/3262* (2013.01); *H01L 27/3265* (2013.01); *H01L 27/3279* (2013.01); *H01L 29/7869* (2013.01); *H01L 29/78606* (2013.01); *H01L 51/52* (2013.01)

(56) References Cited

U.S. PATENT DOCUMENTS

| | | | | |
|---|---|---|---|---|
| 2012/0003795 | A1* | 1/2012 | Noda | H01L 29/66969 |
| | | | | 438/158 |
| 2017/0317217 | A1* | 11/2017 | Ito | H01L 21/0234 |
| 2018/0130910 | A1* | 5/2018 | Yoshitani | H01L 27/1255 |
| 2020/0350341 | A1* | 11/2020 | Hanada | G09F 9/30 |

FOREIGN PATENT DOCUMENTS

| | | |
|---|---|---|
| JP | 2015133484 | 7/2015 |
| KR | 20140055919 | 5/2014 |
| KR | 101686960 B1 | 12/2016 |
| KR | 20190028587 | 3/2019 |

\* cited by examiner

DISPLAY DEVICE AND METHOD OF MANUFACTURING THE SAME

This application claims priority under 35 USC § 119 from, and the benefit of, Korean Patent Application No. 10-2020-0033339, filed on Mar. 18, 2020 in the Korean Intellectual Property Office, the contents of which are herein incorporated by reference in their entirety.

1. TECHNICAL FIELD

Embodiments of the present disclosure are directed to a display device and a method of manufacturing the same.

2. DISCUSSION OF THE RELATED ART

A display device is a device for displaying a moving image or a still image and may be used as a display screen of various products, such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

With the development of information society, requirements for display devices that display images have increased in various forms. Accordingly, in recent years, display device types have expanded to include, inter alia, liquid crystal displays (LCD), plasma display panels (PDP), organic light emitting displays (OLED), and micro light emitting diode displays.

An exemplary display device includes a light emitting diode and a plurality of thin film transistors connected to the light emitting diode. Each of the thin film transistors includes a channel region and source/drain regions, which may be formed of a polycrystalline silicon film.

When a thin film transistor is turned on in an operating voltage range, current flows through the thin film transistor, and when the thin film transistor is turn off in a non-operating range again, the current flow through the thin film transistor terminates.

In addition, device characteristics of the thin film transistor may change depending on the crystal direction, crystal size and crystal defect of the polycrystalline silicon film that forms the channel region and source/drain regions of the thin film transistor.

SUMMARY

Embodiments of the present invention provide a display device that includes thin film transistors that have improved device characteristics.

Embodiments of the present invention provide a method of manufacturing a display device that includes thin film transistors that have improved device characteristics.

According to an embodiment, a display device includes a base substrate; an oxide semiconductor layer disposed on the base substrate and that includes a first channel region, a first drain region located at one side of the first channel region, and a first source region located at the other side of the first channel region; a first gate insulating layer disposed on the first channel region of the oxide semiconductor layer and that overlaps the first channel region of the oxide semiconductor layer and exposes upper surfaces of the first drain region and first source region of the oxide semiconductor layer; a first upper gate electrode disposed on the first gate insulating layer and that overlaps the first gate insulating layer, and an upper interlayer insulating layer disposed on the first upper gate electrode and that covers the first upper gate electrode, a side surface of the first gate insulating layer, and an upper surface of the oxide semiconductor layer exposed by the first source region and the first drain region. The upper interlayer insulating layer includes a first upper interlayer insulating layer disposed on the first upper gate electrode, a second upper interlayer insulating layer disposed on the first upper interlayer insulating layer, and a third upper interlayer insulating layer disposed on the second upper interlayer insulating layer, the first upper interlayer insulating layer includes silicon oxide, each of the second upper interlayer insulating layer and the third upper interlayer insulating layer includes silicon nitride, and a hydrogen concentration in the second upper interlayer insulating layer is less than hydrogen concentration in the third upper interlayer insulating layer.

In an embodiment, the first upper interlayer insulating layer directly contacts the first upper gate electrode, the side surface of the first gate insulating layer, and the upper surface of the oxide semiconductor layer exposed by the first source region and the first drain region.

In an embodiment, the second upper interlayer insulating layer is disposed between the first upper interlayer insulating layer and the third upper interlayer insulating layer.

In an embodiment, the second upper interlayer insulating layer is disposed directly on the first upper interlayer insulating layer, and the third upper interlayer insulating layer is disposed directly on the second upper interlayer insulating layer.

In an embodiment, the hydrogen concentration in the second upper interlayer insulating layer is $1E+22$ atoms/cm3 or less.

In an embodiment, the second upper interlayer insulating layer has a thickness from 300 Å to 2000 Å.

In an embodiment, the first upper interlayer insulating layer has a thickness from 500 Å to 3000 Å.

In an embodiment, the display device further includes a first source electrode and a first drain electrode disposed on the upper interlayer insulating layer. The first source electrode is connected to the first source region through a first contact hole that penetrates the upper interlayer insulating layer, and the first drain electrode is connected to the first drain region through a second contact hole that penetrates the upper interlayer insulating layer.

In an embodiment, the display device further includes a first connection electrode disposed on the upper interlayer insulating layer. The first connection electrode is disposed on the same layer as the first source electrode, and the first connection electrode is connected to the first upper gate electrode through a third contact hole that penetrates the upper interlayer insulating layer.

In an embodiment, the display device further includes a first lower gate electrode disposed between the base substrate and the oxide semiconductor layer; and a lower interlayer insulating layer disposed between the first lower gate electrode and the oxide semiconductor layer. The first lower gate electrode overlaps the first upper gate electrode.

In an embodiment, the lower interlayer insulating layer includes a first lower interlayer insulating layer that contacts the first lower gate electrode, and a second lower interlayer insulating layer disposed between the first lower interlayer insulating layer and the oxide semiconductor layer. The first lower interlayer insulating layer includes silicon nitride, and the second lower interlayer insulating layer contains silicon oxide.

In an embodiment, the display device further includes a capacitor electrode disposed on the same layer as the first lower gate electrode and spaced apart from the first lower gate electrode; an upper gate insulating layer disposed between the capacitor electrode and the base substrate; and a second gate electrode disposed between the upper gate insulating layer and the base substrate. The second gate electrode overlaps the capacitor electrode.

In an embodiment, the display device further includes a lower gate insulating layer disposed between the second gate electrode and the base substrate; and a polycrystalline silicon semiconductor layer disposed between the lower gate insulating layer and the base substrate. The polycrystalline silicon semiconductor layer includes a second channel region that overlaps the second gate electrode, a second drain region located at one side of the second channel region, and a second source region located at the other side of the second channel region.

In an embodiment, the display device further includes a second source electrode and a second drain electrode disposed on the same layer as the first source electrode. The second source electrode is connected to the second source region through a fourth contact hole that penetrates the upper interlayer insulating layer, the lower interlayer insulating layer, the upper gate insulating layer, and the lower gate insulating layer, and the second drain electrode is connected to the second drain region through a fifth contact hole that penetrates the upper interlayer insulating layer, the lower interlayer insulating layer, the upper gate insulating layer, and the lower gate insulating layer.

In an embodiment, the polycrystalline silicon semiconductor layer, the second gate electrode, the capacitor electrode, the second source electrode, and the second drain electrode constitute a driving transistor.

In an embodiment, the lower interlayer insulating layer further includes a third lower interlayer insulating layer disposed between the first lower interlayer insulating layer and the first lower gate electrode, the third lower interlayer insulating layer includes silicon nitride, and the hydrogen concentration in the third lower interlayer insulating layer is less than the hydrogen concentration in the first lower interlayer insulating layer.

In an embodiment, the lower interlayer insulating layer further includes a third lower interlayer insulating layer disposed between the first lower interlayer insulating layer and the second lower interlayer insulating layer. The third lower interlayer insulating layer includes silicon nitride, and the hydrogen concentration in the third lower interlayer insulating layer is less than the hydrogen concentration in the first lower interlayer insulating layer.

In an embodiment, the upper interlayer insulating layer further includes a fourth upper interlayer insulating layer disposed between the second upper interlayer insulating layer and the third upper interlayer insulating layer. The fourth upper interlayer insulating layer includes silicon nitride, and the hydrogen concentration in the fourth upper interlayer insulating layer is between the hydrogen concentration in the second upper interlayer insulating layer and the hydrogen concentration in the third upper interlayer insulating layer.

In an embodiment, the upper interlayer insulating layer further includes a fourth upper interlayer insulating layer disposed between the third upper interlayer insulating layer and the first source electrode. The hydrogen concentration in the fourth upper interlayer insulating layer is less than the hydrogen concentration in the third upper interlayer insulating layer.

According to another embodiment, a method of manufacturing a display device includes forming an oxide semiconductor layer on a base substrate, where the oxide semiconductor layer includes a first channel region, a drain region located at one side of the first channel region, and a first source region located at the other side of the first channel region; forming a first gate insulating layer on the first channel region of the oxide semiconductor layer, where the first gate insulating layer overlaps the first channel region thereof and exposes upper surfaces of the first drain region and first source region of the oxide semiconductor layer; forming a first upper gate electrode on the first gate insulating layer, where the first upper gate electrode overlaps the first gate insulating layer; and forming an upper interlayer insulating layer on the first upper gate electrode, where the upper interlayer insulating layer covers the first upper gate electrode, a side surface of the first gate insulating layer, and an upper surface of the oxide semiconductor layer exposed by the first source region and the first drain region. Forming the upper interlayer insulating layer includes: forming a first upper interlayer insulating layer on the first upper gate electrode; forming a second upper interlayer insulating layer on the first upper interlayer insulating layer; and forming a third upper interlayer insulating layer on the second upper interlayer insulating layer. The first upper interlayer insulating layer includes silicon oxide, each of the second upper interlayer insulating layer and the third upper interlayer insulating layer includes silicon nitride, and a hydrogen concentration in the second upper interlayer insulating layer is less than a hydrogen concentration in the third upper interlayer insulating layer.

In an embodiment, the method further includes forming a contact hole that penetrates the first upper interlayer insulating layer, the second upper interlayer insulating layer, and the third upper interlayer insulating layer, after forming the upper interlayer insulating layer.

In an embodiment, the method further includes performing an annealing process on the contact hole, after forming the contact hole.

In an embodiment, the method further includes forming source/drain electrodes that fill the contact hole, after performing the annealing process on the contact hole.

According to another embodiment, a display device includes a base substrate; a lower interlayer insulating layer disposed on the base substrate; an oxide semiconductor layer disposed on the lower interlayer insulating layer; a first gate insulating layer disposed the oxide semiconductor layer, a first upper gate electrode disposed on the first gate insulating layer; and an upper interlayer insulating layer disposed on the first upper gate electrode. The lower interlayer insulating layer includes a first lower interlayer insulating layer and a second lower interlayer insulating layer, the first lower interlayer insulating layer includes silicon nitride, and the second lower interlayer insulating layer contains silicon oxide. The upper interlayer insulating layer includes a first upper interlayer insulating layer, a second upper interlayer insulating layer, and a third upper interlayer insulating layer. The first upper interlayer insulating layer includes silicon oxide, each of the second upper interlayer insulating layer and the third upper interlayer insulating layer includes silicon nitride, and a hydrogen concentration in the second upper interlayer insulating layer is less than a hydrogen concentration in the third upper interlayer insulating layer.

In an embodiment, the display device further includes a first lower gate electrode disposed between the base substrate and the lower interlayer insulating layer. The first lower gate electrode overlaps the first upper gate electrode.

In an embodiment, the oxide semiconductor layer includes a first channel region, a first drain region located at one side of the first channel region, and a first source region located at the other side of the first channel region. The first gate insulating layer is disposed on the first channel region of the oxide semiconductor layer and overlaps the first channel region of the oxide semiconductor layer and exposes upper surfaces of the first drain region and first source region of the oxide semiconductor layer. The upper interlayer insulating layer covers the first upper gate electrode, a side surface of the first gate insulating layer, and an upper surface of the oxide semiconductor layer exposed by the first source region and the first drain region. In an embodiment, the first lower interlayer insulating layer contacts the first lower gate electrode, and the second lower interlayer insulating layer is disposed between the first lower interlayer insulating layer and the oxide semiconductor layer. The first upper interlayer insulating layer is disposed on the first upper gate electrode, the second upper interlayer insulating layer is disposed on the first upper interlayer insulating layer, and the third upper interlayer insulating layer is disposed on the second upper interlayer insulating layer.

However, embodiments of the present disclosure are not restricted to those set forth herein. The above and other features of embodiments of the present disclosure will become more apparent to one of ordinary skill in the art to which embodiments of the present disclosure pertain by referencing the detailed description of exemplary embodiments of the present disclosure given below.

DETAILED DESCRIPTION OF EXEMPLARY EMBODIMENTS

Hereinafter, exemplary embodiments of the present disclosure will be described with reference to the attached drawings.

Figure 1:
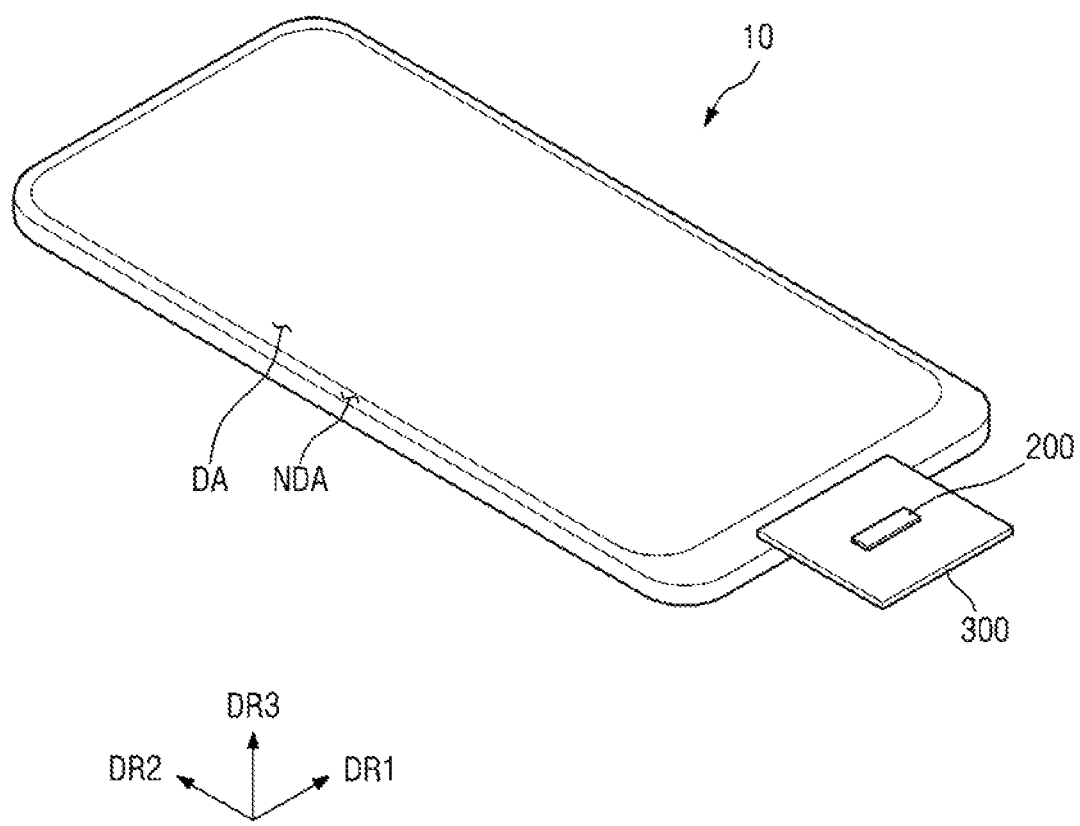
FIG. 1 is a perspective view of a display device according to an embodiment.
Figure 2:
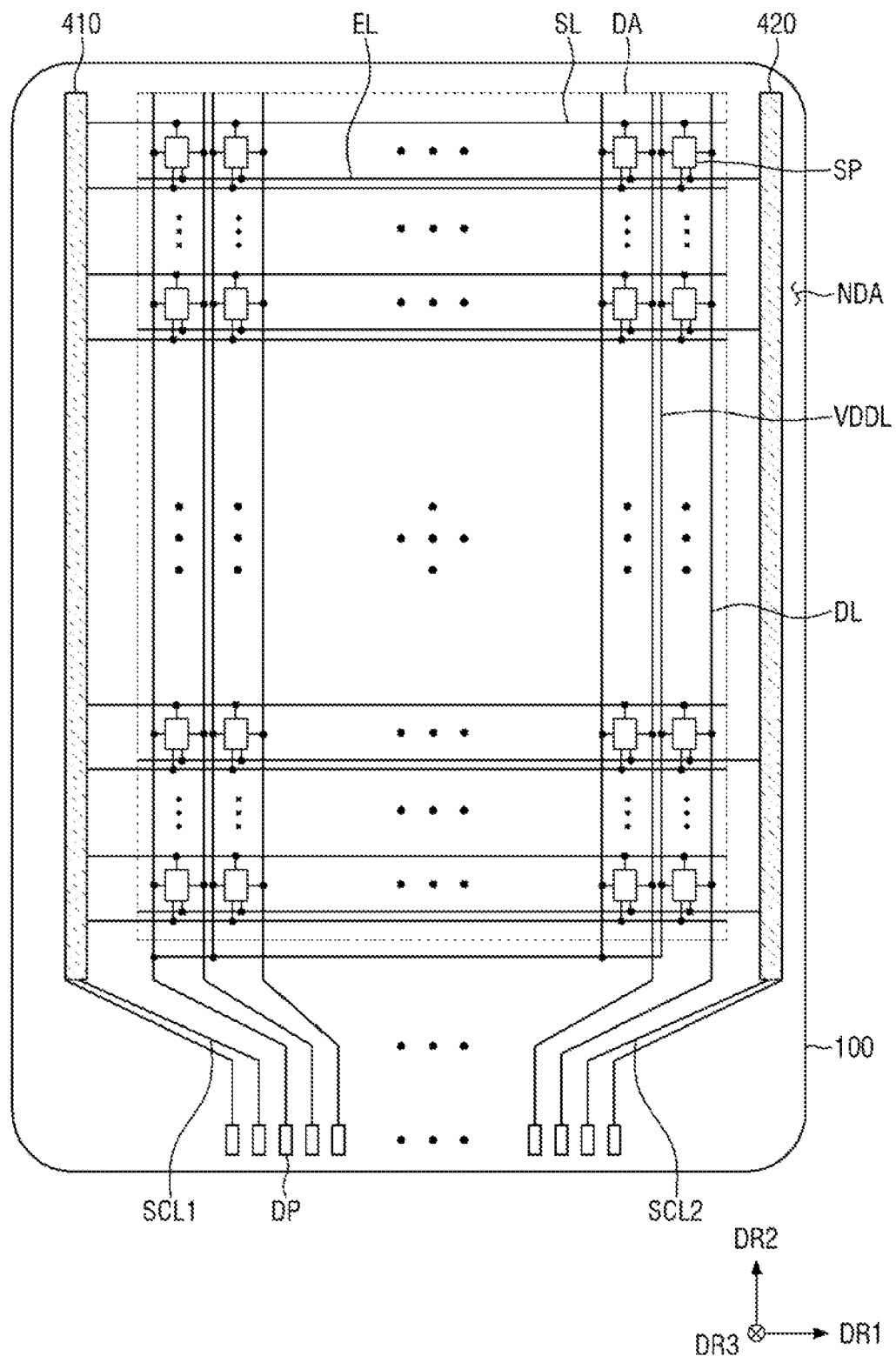
FIG. 2 is a plan view of a display panel according to an embodiment.

FIG. 1 is a perspective view of a display device according to an embodiment, and FIG. 2 is a plan view of a display panel according to an embodiment.

Hereinafter, a display device 10 will be described assuming that the display device 10 is an organic light emitting display device, but embodiments of the present disclosure are not limited thereto.

Referring to FIGS. 1 and 2, the display device 10 according to an embodiment includes a display panel 100, a display driver 200, and a circuit board 300.

According to an embodiment, the display panel 100 has a rectangular planar shape that has short sides in a first direction DR1, such as an X-axis direction, and long sides in a second direction DR2 that crosses the first direction, such as a Y-axis direction. The corner where the short side in the first direction meets the long side in the second direction may have a round shape of a predetermined curvature or a right angle shape. The planar shape of the display panel 100 is not limited to a rectangular shape, and in other embodiments may have another polygonal shape, a circular shape, or an elliptical shape. The display panel 100 is flat, but embodiments of the present disclosure are not limited thereto. For example, in another embodiment, the display panel 100 includes curved portions formed at the left and right ends thereof that have a constant curvature or a variable curvature. In addition, the display panel 100 may be flexible to be bent, warped, folded, or rolled.

According to an embodiment, the display panel 100 includes a display area DA in which sub-pixels SP are formed to display an image, and a non-display area NDA that is a peripheral area of the display area DA. When the display panel 100 includes a curved portion, the display area DA can also be disposed on the curved portion. In this case, an image of the display panel 100 can also be seen on the curved portion.

According to an embodiment, the display area DA is provided with scan lines SL, light emitting lines EL, data lines DL, and first driving voltage lines VDDL, which are connected to the sub-pixels SP, in addition to the sub-pixels SP. The scan lines SL and the light emitting lines EL extend in parallel in the first direction DR1, and the data lines DL extend in parallel in the second direction DR2. The first driving voltage lines VDDL extend in parallel in the second direction DR2 in the display area DA. The first driving voltage lines VDDL are connected to each other in the non-display area NDA.

According to an embodiment, each of the sub-pixels SP is connected to at least one of the scan lines SL, at least one of the data lines DL, at least one of the light emitting lines EL, and at least one of the first driving voltage lines VDDL. Although FIG. 2 shows that each of the sub-pixels SP is connected to two scan lines SL, one data line DL, one light emitting line EL, and the first driving voltage line VDDL, embodiments of the present disclosure are not limited thereto, and in other embodiments, each of the sub-pixels SP can be connected to three scan lines SL, not two scan lines SL.

According to an embodiment, each of the sub-pixels SP includes a driving transistor, at least one switching transistor, a light emitting element, and a capacitor. The driving transistor supplies a driving current to the light emitting element based on a data voltage supplied to the gate electrode, thereby emitting light. The driving transistor and the at least one transistor are thin film transistors. The light emitting element emits light based on the driving current of the driving transistor DT. The light emitting element is an organic light emitting diode that includes a first electrode, an organic light emitting layer, and a second electrode. The capacitor maintains the data voltage supplied to the gate electrode of the driving transistor at a constant level.

According to an embodiment, the non-display area NDA extends from an outer edge of the display area DA to the edge of the display panel 100. The non-display area NDA is provided with a scan driver 410 that transmits scan signals to the scan lines SL and pads DP connected to the data lines DL. Since the circuit board 300 is attached onto the pads DP, the pads DP are disposed at one side edge of the display panel 100, such as the lower side edge of the display panel 100.

According to an embodiment, the scan driver 410 is connected to the display driver 200 through a plurality of first scan control lines SCL1. The scan driver 410 receives a scan control signal from the pads DP from the plurality of first scan control lines SCL1. The scan driver 410 generates scan signals based on the scan control signal, and sequentially outputs the scan signals to the scan lines SL. Sub-pixels SP to which data voltages are to be supplied are selected by the scan signals of the scan driver 410, and data voltages are supplied to the selected sub-pixels SP.

According to an embodiment, a light emission control driver 420 is connected to a display driving circuit through a plurality of second scan control lines SCL2. The light emission control driver 420 receives a light emission control signal from the pads DP from the plurality of second scan control signals SCL2. The light emission control driver 420 generates light emission control signals based on the light emission control signal received from the pads DP, and sequentially outputs the light emission control signals to the light emitting lines EL.

Although FIG. 2 illustrates the scan driver 410 as being disposed outside and on one side of the display area DA and the light emission control driver 420 as being disposed outside and on the other side of the display area DA, embodiments of the present disclosure are not limited thereto. In other embodiments, both the scan driver 410 and the light emission control driver 420 may be disposed outside on a same side of the display area DA, or outside on both sides of the display area DA.

According to an embodiment, the display driver 200 receives externally supplied digital video data and timing signals. The display driver 200 converts the digital video data into analog positive/negative data voltages and supplies them to the data lines DL. The display driver 200 generates and supplies a scan control signal for controlling the operation timing of the scan driver 410 through the first scan control lines SCL1. The display driver 200 generates and supplies a light emission control signal for controlling the operation timing of the light emission control driver 420 through the second scan control lines SCL2. The display driver 200 supplies a first driving voltage to the first driving voltage line VDDL.

According to an embodiment, the display driver 200 is formed as an integrated circuit (IC) and attached onto the circuit board 300 by a chip on film (COF) method. However, embodiments are not limited thereto, and in other embodiments, the display driver 200 may be directly attached onto the display panel 100 by a chip on glass (COG) method, a chip on plastic (COP) method, or an ultrasonic bonding method.

According to an embodiment, the circuit board 300 is attached onto the pads DP using an anisotropic conductive film. Thus, lead lines of the circuit board 300 are electrically connected to the pads DP. The circuit board 300 may be one of a flexible printed circuit board, a printed circuit board, or a flexible film such as a chip on film.

Figure 3:
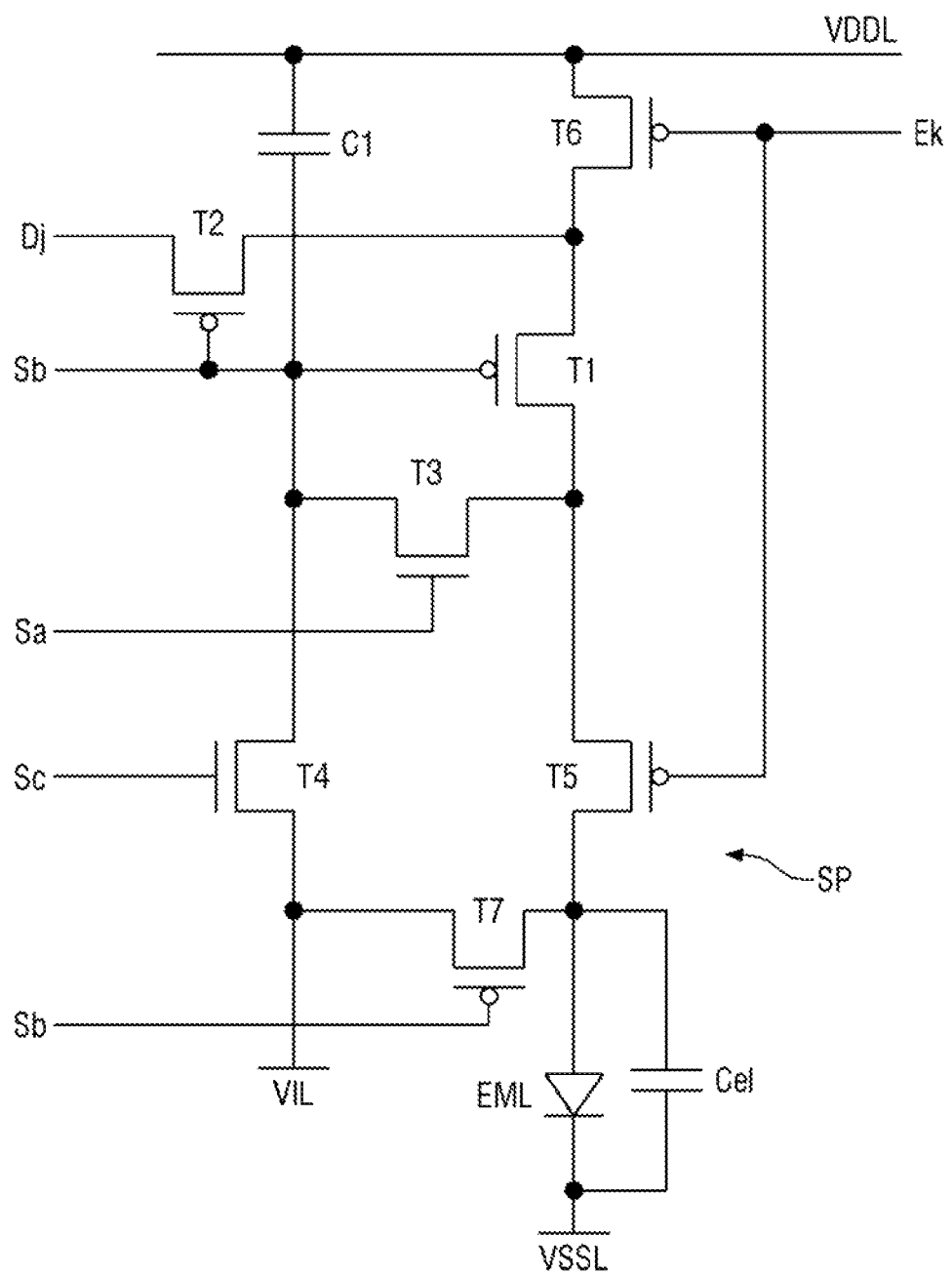
FIG. 3 is a circuit diagram of a sub-pixel of FIG. 2.

FIG. 3 is a circuit diagram of a sub-pixel of FIG. 2.

FIG. 3 illustrates a sub-pixel SP connected to an au scan line, $b_{th}$ scan lines, a $c_{th}$ scan line, and a $j_{th}$ data line Dj.

Referring to FIG. 3, according to an embodiment, the sub-pixel SP is connected to the as scan line, $b_{th}$ scan lines, the $c_{th}$ scan line, and the $j_{th}$ data line Dj. Further, the sub-pixel SP is connected to a first driving voltage line VDDL to which a first driving voltage is applied, an initialization voltage line VIL to which an initialization voltage is applied, and a second driving voltage line VSSL to which a second driving voltage is applied.

According to an embodiment, the sub-pixel SP includes a driving transistor, a light emitting element, switching elements, and a first capacitor C1. For example, the sub-pixel SP includes a first transistor T1 as the driving transistor, and second to seventh transistors T2, T3, T4, T5, T6, and 17 as the switching elements. However, the sub-pixel SP is not limited to an embodiment shown in FIG. 3.

According to an embodiment, the first transistor T1 includes a first gate electrode, a first source electrode, and a first drain electrode. The first transistor T1 controls a drain-source current Ids, hereinafter referred to as a "driving current", based on the data voltage applied to the first gate electrode. The driving current Ids that flows through the channel of the first transistor T1 is proportional to a square of a difference between a gate-source voltage Vgs and a threshold voltage Vth of the first transistor T1, as expressed by Equation 1 below.

$$Ids = k' \times (Vgs - Vth)^2 \qquad \text{[Equation 1]}$$

In Equation 1, according to an embodiment, k' is a coefficient determined by the structure and physical characteristics of the first transistor T1, Vgs is a voltage between the first gate electrode and first source electrode of the first transistor T1, and Vth is a threshold voltage of the first transistor T1.

According to an embodiment, the light emitting element EML emits light based on with the driving current Ids. The amount of light emitted by the light emitting element EML is proportional to the drive current Ids. The light emitting element EML according to a present embodiment is an organic light emitting diode that includes a first electrode, a second electrode, and an organic light emitting layer disposed between the first electrode and the second electrode. Alternatively, in other embodiments, the light emitting element EML is an inorganic light emitting element that includes a first electrode, a second electrode, and an inorganic semiconductor disposed between the first electrode and the second electrode. Alternatively, in other embodiments, the light emitting element EML is a quantum dot light emitting element that includes a first electrode, a second electrode, and a quantum dot light emitting layer disposed between the first electrode and the second electrode. Alternatively, in other embodiments, the light emitting element EML may be a micro light emitting diode.

According to an embodiment, a first electrode of the light emitting element EML is connected to a second electrode of the fifth transistor T5, and the second electrode thereof is connected to the second driving voltage line VSSL. A parasitic capacitance Cel can form between the anode electrode and cathode electrode of the light emitting element EML.

According to an embodiment, the second transistor T2 is turned on by the scan signal of the $b_{th}$ scan line Sb to connect the first source electrode of the first transistor T1 to the $j_{th}$ data line DLj. The second transistor T2 includes a second gate electrode, a second source electrode, and a second drain electrode. The second gate electrode of the second transistor T2 is connected to the $b_{th}$ scan line Sb, the second source electrode thereof is connected to the first source electrode of the first transistor T1, and the second drain electrode thereof may be connected to the $j_{th}$ data line Dj.

According to an embodiment, the third transistor T3 is turned on by the scan signal of the $a_{th}$ scan line Sa to connect the first gate electrode of the first transistor T1 to the first drain electrode of the first transistor T1. That is, when the third transistor T3 is turned on, the first gate electrode of the first transistor T1 is connected to the first drain electrode of the first transistor T1, and thus the first transistor T1 is driven as a diode. The third transistor T3 includes a third gate electrode, a third source electrode, and a third drain electrode. The third gate electrode of the third transistor T3 is connected to the an scan line Sa, the third source electrode thereof is connected to the first drain electrode of the first transistor T1, and the third drain electrode thereof is connected to the first gate electrode of the first transistor T1.

According to an embodiment, the fourth transistor T4 is turned on by the scan signal of the $c_{th}$ scan line Sc to connect the first gate electrode of the first transistor T1 to the initialization voltage line VIL. Therefore, the first gate electrode of the first transistor T1 discharges to the initialization voltage of the initialization voltage line VIL. The fourth transistor T4 includes a fourth gate electrode, a fourth source electrode, and a fourth drain electrode. The fourth gate electrode of the fourth transistor T4 is connected to the $c_{th}$ scan line Sc, the fourth source electrode thereof is connected to the first gate electrode of the first transistor T1, and the fourth drain electrode thereof is connected to the initialization voltage line VIL.

According to an embodiment, the fifth transistor T5 is connected between the first drain electrode of the first transistor T1 and the anode electrode of the light emitting element EML. The fifth transistor T5 is turned on by the light emission control signal of the $k_{th}$ light emitting line Ek to connect the first drain electrode of the first transistor T1 to the anode electrode of the light emitting element EML. The fifth transistor T5 includes a fifth gate electrode, a fifth source electrode, and a fifth drain electrode. The fifth gate electrode of the fifth transistor T5 is connected to the $k_{th}$ light emitting line Ek, the fifth source electrode thereof is connected to the first drain electrode of the first transistor T1, and the fifth drain electrode thereof is connected to the anode electrode (or first electrode) of the light emitting element EML.

According to an embodiment, the sixth transistor T6 is turned on by the light emission control signal of the $k_{th}$ light emitting line Ek to connect the first source electrode of the first transistor T1 to the first driving voltage line VDDL. The sixth transistor T6 includes a sixth gate electrode, a sixth source electrode, and a sixth drain electrode. The sixth gate electrode of the sixth transistor T6 is connected to the $k_{th}$ light emitting line Ek, the sixth source electrode thereof is connected to the first driving voltage line VDDL, and the sixth drain electrode thereof is connected to the first source electrode of the first transistor T1. When both the fifth transistor T5 and the sixth transistor T6 are turned on, the driving current Ids is supplied to the light emitting element EML.

According to an embodiment, the seventh transistor T7 is turned on by the scan signal of the $b_{th}$ scan line Sb to connect the anode electrode of the light emitting element EML to the initialization voltage line VIL. The anode of the light emitting device EML discharges to the initialization voltage. The seventh transistor T7 includes a seventh gate electrode, a seventh source electrode, and a seventh drain electrode. The seventh gate electrode of the seventh transistor T7 is connected to the $b_{th}$ scan line Sb, the seventh source electrode thereof is connected to the anode electrode or first electrode of the light emitting element EML, and the seventh drain electrode thereof is connected to the initialization voltage line VIL.

According to an embodiment, the first capacitor C1 is formed between the first drain electrode of the first transistor T1 and the first driving voltage line VDDL. One electrode of the first capacitor C1 is connected to the first drain electrode of the first transistor T1, and the other electrode thereof may be connected to the first driving voltage line VDDL.

According to an embodiment, each of the first to seventh transistors T1, T2, T3, T4, T5, T6, and T7 includes a semiconductor layer. Some of the first to seventh transistors T1, T2, T3, T4, T5, T6, and T7 include semiconductor layers that include polycrystalline silicon, and the other of the first to seventh transistors T1, T2, T3, T4, T5, T6, and T7 include semiconductor layers that include oxide. For example, the semiconductor layers of the first to seventh transistors T1, T2, T3, T4, T5, T6, and T7 can be made of polycrystalline silicon, or the semiconductor layers of the first transistor T1 and the fifth to seventh transistors T5 to T7 can be made of polycrystalline silicon and the semiconductor layers of the third transistor T3 and the fourth transistor T4 can be made of oxide. For example, the semiconductor layer of the driving transistor includes polycrystalline silicon, and the semiconductor layer of the switching transistors includes an oxide. The semiconductor layer of the switching transistors include a first channel region that overlaps the gate electrode of the switching transistor, a first drain region located at one side of the first channel region, and a first source region located at the other side of the first channel region. The semiconductor layer of the driving transistor includes a second channel region that overlaps the gate electrode of the driving transistor, a second drain region located at one side of the second channel region, and a second source region located at the other side of the second channel region.

According to an embodiment, compared to the first channel region, the first source/drain regions include a larger number of carrier ions. In an embodiment, the carrier ions include oxygen ions ($O^{2-}$), vacancies (Vo) that occur when bound oxygen atoms are broken, and hydrogen ions ($H^+$) inflowing from adjacent layers. The rate or concentration of oxygen ions ($O^{2-}$) and the rate or concentration of vacancies (Vo) can be pre-determined when forming an oxide semiconductor layer 145, whereas hydrogen ions ($H^+$) inflowing from adjacent layers might not be controlled. The concentration of hydrogen ions ($H^+$) inflowing from adjacent layers can increase the threshold voltage of an element such as a switching transistor, and can deteriorate the characteristics of the element.

Figure 4:
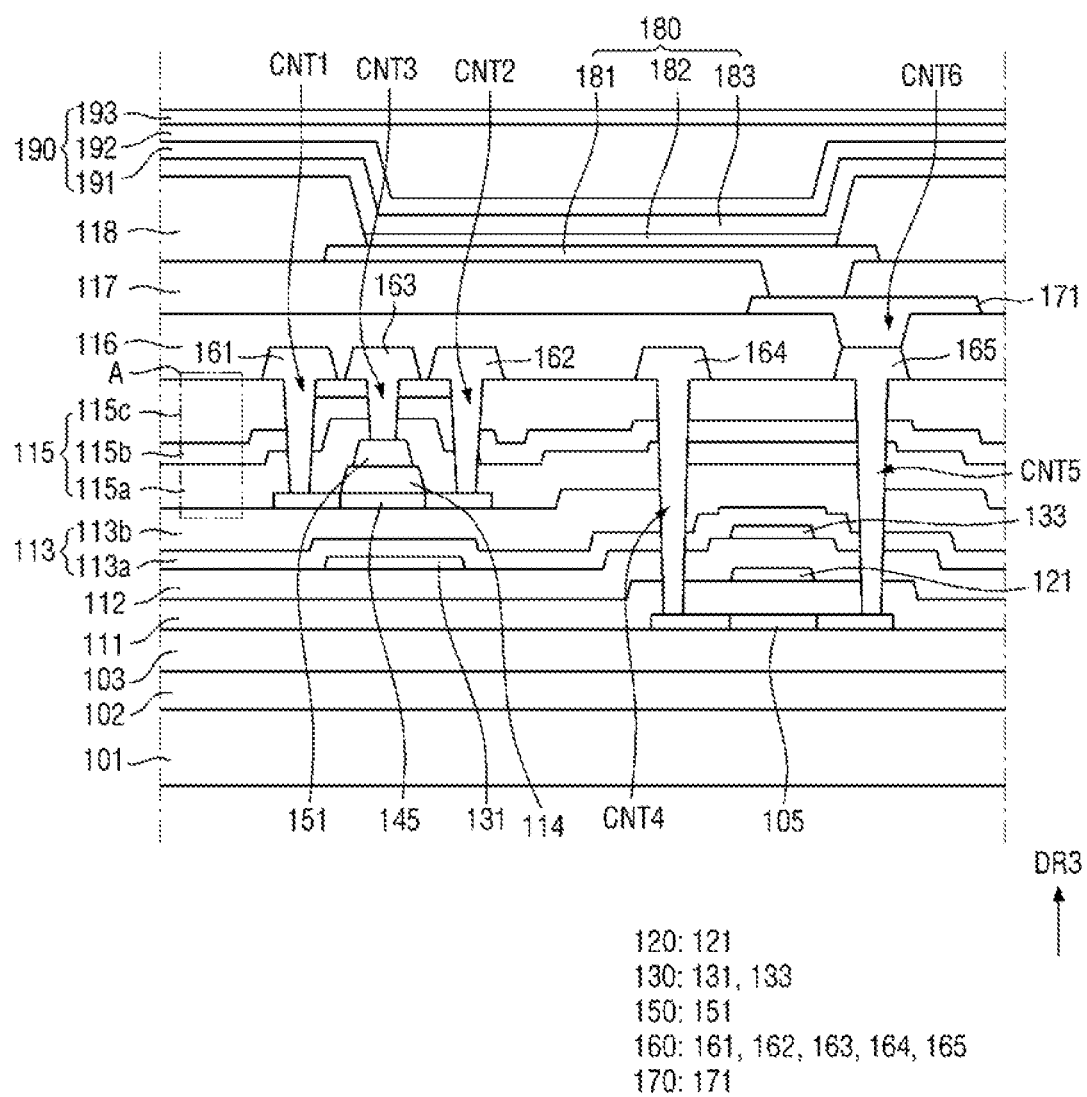
FIG. 4 is a cross-sectional view of a display panel according to an embodiment.
Figure 5:
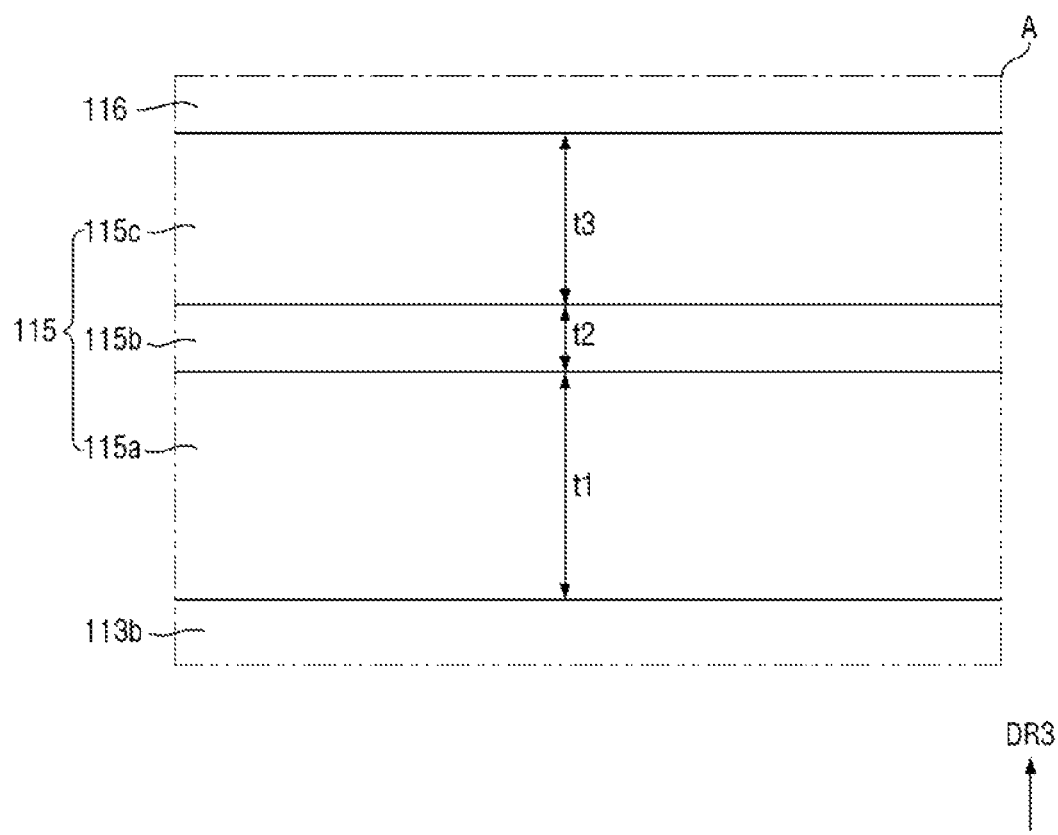
FIG. 5 is an enlarged view of area A of FIG. 4.

FIG. 4 is a cross-sectional view of a display panel according to an embodiment, and FIG. 5 is an enlarged view of the area A of FIG. 4. FIG. 4 illustrates a cross-sectional structure of a driving transistor and a cross-sectional structure of a switching transistor.

Referring to FIGS. 4 and 5, according to an embodiment, the switching transistor includes an oxide semiconductor layer 145, a first upper gate electrode 151, a first lower gate electrode 131, a first source electrode 161, and a first drain electrode 162, and the driving transistor includes a polycrystalline silicon semiconductor layer 105, a second gate electrode 121, a second source electrode 164, and a second drain electrode 165.

According to an embodiment, the display panel 10 includes a base substrate 101, a barrier layer 102 on the base substrate 101, a buffer layer 103 on the barrier layer 102, the polycrystalline silicon semiconductor layer 105 on the buffer layer 103, a lower gate insulating layer 111 on the polycrystalline silicon semiconductor layer 105 and the buffer layer 103, the second gate electrode 121 on the lower gate insulating layer 111, an upper gate insulating layer 112 on the second gate electrode 121 and the lower gate insulating layer 111, the first lower gate electrode 131 and a capacitor electrode 133 on the upper gate insulating layer 112, a lower interlayer insulating layer 113 on the first lower gate electrode 131, the capacitor electrode 133 and the upper gate insulating layer 112, the oxide semiconductor layer 145 on the lower interlayer insulating layer 113, a first gate insulating layer 114 on the oxide semiconductor layer 145, the first upper gate electrode 151 on the first gate insulating layer 114, an upper interlayer insulating layer 115 on the first upper gate electrode 151 and the lower interlayer insulating layer 113, first source/drain electrodes 161 and 162, a first connection electrode 163, and second source/drain electrodes 164 and 165 on the upper interlayer insulating layer 115, a first via layer 116 on the first source/drain electrodes 161 and 162, the first connection electrode 163, the second source/drain electrodes 164 and 165 and the upper interlayer insulating layer 115, a second connection electrode 171 on the first via layer 116, a second via layer 117 on the second connection electrode 171 and the first via layer 116, an anode electrode 181 on the second via layer 117, a bank layer 118 on the second via layer 117 and that partially covers the anode electrode 181, a light emitting layer 182 on the anode electrode 181, a cathode electrode 183 on the light emitting layer 182 and the bank layer 118, and an encapsulation layer 190 on the cathode electrode 183.

According to an embodiment, the base substrate 101 supports each layer disposed thereon. When the organic light emitting display device is a back-sided or double-sided emission type, a transparent substrate is used as the base substrate 101. When the organic light emitting display device is a front-sided emission type, a translucent or opaque substrate as well as the transparent substrate can be used as the base substrate 101. The base substrate 101 may include a rigid material such as glass or quartz.

According to an embodiment, the barrier layer 102 is disposed on the base substrate 101. The barrier layer 102 prevents the diffusion of impurities and the penetration of moisture or external air, and can planarize a surface. The barrier layer 102 may include silicon nitride, silicon oxide, or silicon oxynitride. In some embodiments, the barrier layer 102 is omitted, depending on the type of the base substrate 101 or process conditions.

According to an embodiment, the buffer layer 103 is disposed on the barrier layer 102. The buffer layer 103 may include at least one of silicon nitride, silicon oxide, or silicon oxynitride. In some embodiments, the buffer layer 103 is omitted, depending on the type of the base substrate 101 or process conditions.

According to an embodiment, the polycrystalline silicon semiconductor layer 105 is disposed on the buffer layer 103. The polycrystalline silicon semiconductor layer 105 may be made of amorphous silicon or crystalline polysilicon. In this case, crystalline polysilicon can be formed by crystallizing amorphous silicon. Amorphous silicon can be crystallized by various methods, such as rapid thermal annealing (RTA), solid phase crystallization (SPC), excimer laser annealing (ELA), metal induced crystallization (MIC), metal induced lateral crystallization (MILC), or sequential lateral solidification (SLS).

According to an embodiment, the polycrystalline silicon semiconductor layer 105 includes a second channel region that overlaps the second gate electrode 121, a second drain region at one side of the second channel region, and a second source region at the other side of the second channel region.

According to an embodiment, the lower gate insulating layer 111 is disposed on the polycrystalline silicon semiconductor layer 105 and has a gate insulating function. The lower gate insulating layer 111 may include a silicon compound or a metal oxide. For example, the lower gate insulating layer 111 may include silicon oxide, silicon nitride, silicon oxynitride, aluminum oxide, tantalum oxide, hafnium oxide, zirconium oxide, or titanium oxide, which may be used alone or in combination with each other. The lower gate insulating layer 111 may be a single-layer film or a multi-layer film formed of stacked layers of different materials.

According to an embodiment, a first conductive layer 120 is disposed on the lower gate insulating layer 111. The first conductive layer 120 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The first conductive layer 120 may be a single-layer film or a multi-layer film.

According to an embodiment, the first conductive layer 120 includes the second gate electrode 121.

According to an embodiment, the upper gate insulating layer 112 is disposed on the first conductive layer 120 and has a gate insulating function. The upper gate insulating layer 112 may include a silicon compound or a metal oxide. For example, the upper gate insulating layer 112 may include silicon oxide, silicon nitride, silicon oxynitride, aluminum oxide, tantalum oxide, hafnium oxide, zirconium oxide, or titanium oxide, which may be used alone or in combination with each other. The upper gate insulating layer 112 may be a single-layer film or a multi-layer film formed of stacked layers of different materials.

According to an embodiment, a second conductive layer 130 is disposed on the upper gate insulating layer 112. The second conductive layer 130 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The second conductive layer 130 may be a single-layer film or a multi-layer film.

According to an embodiment, the second conductive layer 130 includes the first lower gate electrode 131 and the capacitor electrode 133. The first lower gate electrode 131 overlaps the first channel region of the oxide semiconductor layer 145, and the capacitor electrode 133 overlaps the second channel region of the polysilicon semiconductor layer 105.

According to an embodiment, the lower interlayer insulating layer 113 is disposed on the second conductive layer 130 and the upper gate insulating layer 112. The lower interlayer insulating layer 113 includes a first lower interlayer insulating layer 113a disposed on the second conductive layer 130 and the upper gate insulating layer 112, and a second lower interlayer insulating layer 113b on the first lower interlayer insulating layer 113a and that is spaced apart from the second conductive layer 130 with the first lower interlayer insulating layer 113a therebetween. The first lower interlayer insulating layer 113a is disposed between the second lower interlayer insulating layer 113b and the second conductive layer 130. The first lower interlayer insulating layer 113a and the second lower interlayer insulating layer 113b contact each other.

According to an embodiment, the first lower interlayer insulating layer 113a and the second lower interlayer insulating layer 113b include materials that differ from each other. The first lower interlayer insulating layer 113a may include silicon nitride, and the second lower interlayer insulating layer 113b may include silicon oxide. The first lower interlayer insulating layer 113a and the second lower interlayer insulating layer 113b may be formed by chemical vapor deposition.

In general, according to an embodiment, compared to silicon oxide, silicon nitride prevents the penetration of impurities, and compared to an insulating layer that contains silicon oxide, an insulating layer that contains silicon nitride has a higher hydrogen ion concentration. This is because the gas used when forming an insulating layer that contains silicon oxide through chemical vapor deposition is different from the gas used when forming an insulating layer that contains silicon nitride through chemical vapor deposition. More specifically, ammonium gas is one of the gases used to form an insulating layer containing silicon nitride through chemical vapor deposition, and in this case, the ammonium gas can cause an increase in hydrogen ion concentration in the insulating layer that contains silicon nitride. On the other hand, when forming an insulating layer that contains silicon oxide, ammonium gas is not used.

According to an embodiment, the first lower gate electrode 131 and the capacitor electrode 133 are formed through etching after the second conductive layer material is entirely deposited on the upper gate insulating layer 112. The etching may be dry etching, and an etching gas such as fluorine chloride (HF) may be used during dry etching. When the first lower gate electrode 131 is formed through dry etching, fluorine ions (F−) of fluorine chloride (HF) may remain on the surface of the first lower gate electrode 131. Impurities such as fluorine ions (F−) that remain on the surface of the first lower gate electrode 131 can penetrate into the overlying oxide semiconductor layer 145 during an annealing process, thereby causing device defects, such as lowering the threshold voltage of the oxide semiconductor layer 145.

The lower interlayer insulating layer 113 according to an embodiment has a structure in which the first lower interlayer insulating layer 113a is disposed on the first lower gate electrode 131, and the second lower interlayer insulating layer 113b, which contains silicon oxide, which has a lower hydrogen concentration than the first lower interlayer insulating layer 113, is disposed on the first lower interlayer insulating layer. The first lower interlayer insulating layer 113a contains silicon nitride, which is better at preventing the penetration of impurities than silicon oxide, and the second lower interlayer insulating layer 113b contains silicon oxide, which has a lower hydrogen concentration than the first lower interlayer insulating layer 113a. Thus, impurities can be prevented from diffusing from the first lower gate electrode 131 into the oxide semiconductor layer 145, and preventing hydrogen gas particles from penetrating into the oxide semiconductor layer 145.

According to an embodiment, the oxide semiconductor layer 145 is disposed on the lower interlayer insulating layer 113. The oxide semiconductor layer 145 includes an oxide. The oxide may include G-I—Z—O, or an oxide of at least one of zinc (Zn), indium (In), gallium (Ga), tin (Sn) cadmium (Cd), germanium (Ge), or hafnium (Hf), or a combination thereof. The oxide may include at least one of indium-gallium-zinc oxide (IGZO, indium gallium zinc oxide), zinc-tin oxide (ZTO), or indium tin oxide (IZO).

According to an embodiment, the first gate insulating layer 114 is disposed on the oxide semiconductor layer 145 and has a gate insulating function. The first gate insulating layer 114 may include a silicon compound or a metal oxide. For example, the first gate insulating layer 114 may include silicon oxide, silicon nitride, silicon oxynitride, aluminum oxide, tantalum oxide, hafnium oxide, zirconium oxide, or titanium oxide, which may be used alone or in combination with each other. The first gate insulating layer 114 may be a single-layer film or a multi-layer film formed of stacked layers of different materials.

According to an embodiment, the first source region of the oxide semiconductor layer 145 and a part of the upper surface of the first drain region of the oxide semiconductor layer 145 are exposed by the first gate insulating layer 114.

According to an embodiment, the first gate insulating layer 114 overlaps the first channel region of the oxide semiconductor layer 145, but does not overlap the first source region and first drain region of the oxide semiconductor layer 145.

According to an embodiment, a third conductive layer 150 is disposed on the first gate insulating layer 114. The third conductive layer 150 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The third conductive layer 150 may be a single-layer film or a multi-layer film.

According to an embodiment, the second conductive layer 150 includes the first upper gate electrode 151. The first upper gate electrode 151 overlaps the first gate insulating layer 114.

In an embodiment, the gate electrode of the switching transistor is a double gate electrode that includes the first upper gate electrode 151 and the first lower gate electrode 131. The first upper gate electrode 151 is electrically connected to the first lower gate electrode 131. The gate electrode of the driving transistor is a double gate electrode including the capacitor electrode 133 and the second gate electrode 121. The capacitor electrode 133 and the second gate electrode 121 form a capacitor with the upper gate insulating layer 112 interposed therebetween.

According to an embodiment, the upper interlayer insulating layer 115 is disposed on the second conductive layer 150 and the second lower interlayer insulating layer 113*b*. The upper interlayer insulating layer 115 covers the first upper gate electrode 151, the side surface of the first gate insulating layer 114, and the upper surfaces of the exposed oxide semiconductor layer of the first source region and the first drain region.

According to an embodiment, the upper interlayer insulating layer 115 includes a first upper interlayer insulating layer 115*a* disposed on the first upper gate electrode 151 and the second lower interlayer insulating layer 113*b*, a second upper interlayer insulating layer 115*b* disposed on the first upper interlayer insulating layer 115*a*, and a third upper interlayer insulating layer 115*c* disposed on the second upper interlayer insulating layer 115*b*.

According to an embodiment, the first upper interlayer insulating layer 115*a* directly contacts the first upper gate electrode 151, the side surface of the first gate insulating layer 114, the exposed upper surfaces of the first source region and the first drain region, and the upper surface of the second lower interlayer insulating layer 113*b*. The second upper interlayer insulating layer 115*b* is directly disposed on the first upper interlayer insulating layer 115*a*, and the third upper interlayer insulating layer 115*c* is directly disposed on the second upper interlayer insulating layer 115*b*.

According to an embodiment, the first upper interlayer insulating layer 115*a* includes silicon oxide, and each of the second upper interlayer insulating layer 115*b* and the third upper interlayer insulating layer 115*c* includes silicon nitride.

According to an embodiment, the hydrogen concentration in the first upper interlayer insulating layer 115*a* is less than the hydrogen concentrations in each of the second upper interlayer insulating layer 115*b* and the third upper interlayer insulating layer 115*c*.

In the upper interlayer insulating layer 115 according to an embodiment, the first upper interlayer insulating layer 115*a* is disposed on the first upper gate electrode 131 and the oxide semiconductor layer 145, and the upper interlayer insulating layers 115*b* and 115*c* are disposed on the first upper interlayer insulating layer 115*a*. The first upper interlayer insulating layer 115*a* has a hydrogen concentration that is less than that of each of the second upper interlayer insulating layer 115*b* and the third upper interlayer insulating layer, and the upper interlayer insulating layers 115*b* and 115*c* includes silicon nitride, which better prevents the penetration of impurities than first upper interlayer insulating layer 115*a*, which contains silicon oxide.

According to an embodiment, the upper interlayer insulating layers 115*b* and 115*c* have a plurality of hydrogen concentrations, as described above, and in this case, the hydrogen ions in the upper interlayer insulating layers 115*b* and 115*c* can diffuse into the oxide semiconductor layer 145. In particular, before forming the fourth conductive layer 160, which is described below, an annealing process of applying heat is performed to form contact holes CNT1 to CNT5, and in this case, heat causes the hydrogen ions in the upper interlayer insulating layers 115*b* and 115*c* to diffuse into the oxide semiconductor layer 145.

The upper interlayer insulating layer 115 according to an embodiment has a hydrogen concentration in the second upper interlayer insulating layer 115*b* that is less than the hydrogen concentration in the third upper interlayer insulating layer 115*c*, and thus it is possible to minimize the diffusion of hydrogen ions in the upper interlayer insulating layers 115*b* and 115*c* to the oxide semiconductor layer 145.

According to an embodiment, the hydrogen concentration in the second upper interlayer insulating layer 115*b* is about 1E+22 atoms/cm3. When the hydrogen concentration in the second upper interlayer insulating layer 115*b* is about 1E+22 atoms/cm3, the amount of hydrogen ions that diffuse from the second upper interlayer insulating layer 115*b* to the oxide semiconductor layer 145 is reduced.

For the second upper interlayer insulating layer 115*b* and third upper interlayer insulating layer 115*c* according to an embodiment to have different hydrogen concentrations from each other, the second upper interlayer insulating layer 115*b* and the third upper interlayer insulating layer 115*c* are formed by different ammonium flow rates when deposited by chemical vapor deposition.

For example, according to an embodiment, the second upper interlayer insulating layer 115*b* is formed by ammonium having a flow rate of about 4000 cc to 6000 cc, and the third upper interlayer insulating layer 115*c* is formed by ammonium having a flow rate of about 19000 cc or greater.

According to an embodiment, one surface of each of the upper interlayer insulating layers 115*a* and 115*b* conformally reflects a lower step formed by the oxide semiconductor layer 145, the first gate insulating layer 114, and the first upper gate electrode 151. In contrast, one surface of the third upper interlayer insulating layer 115*c* in the third direction DR3 is flat.

According to an embodiment, each of the first upper interlayer insulating layer 115*a* to third upper interlayer insulating layer 115*c* have different thicknesses.

Referring to FIG. 5, according to an embodiment, the first upper interlayer insulating layer 115*a* has a first thickness t1, the second upper interlayer insulating layer 115*b* has a second thickness t2, and the third upper interlayer insulating layer 115*c* has a third thickness t3.

According to an embodiment, the first thickness t1 ranges from 500 Å to 3000 Å.

According to an embodiment, the sum of the second thickness t2 and the third thickness t3 is about 2000 Å. The second thickness t2 ranges from, for example, 300 Å to 2000 Å. When the second thickness t2 is 2000 Å, the third upper interlayer insulating layer 115*c* can be omitted.

According to an embodiment, the thicknesses t1 to t3 of the upper interlayer insulating layers 115*a*, 115*b*, and 115*c* are measured in areas in which there are no lower steps formed by the oxide semiconductor layer 145, the first gate insulating layer 114, and the first upper gate electrode 151.

According to an embodiment, a fourth conductive layer 160 is disposed on the upper interlayer insulating layer 115. The fourth conductive layer 160 includes at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The fourth conductive layer 160 may be a single-layer film or a multi-layer film.

According to an embodiment, fourth conductive layer 160 includes first source/drain electrodes 161 and 163 and second source/drain electrodes 164 and 165. The fourth conductive layer 160 further includes the first connection electrode 163. The first source/drain electrodes 161 and 163 are connected to the first source/drain regions of the oxide semiconductor layer 145 through respective contact holes CNT1 and CNT2 that penetrate the upper interlayer insulating layer 115, and the second source/drain electrodes 164 and 165 are connected to the second source/drain regions of the polycrystalline silicon semiconductor layer 105 through respective contact holes CNT4 and CNT5 that penetrate the upper interlayer insulating layer 115, the lower interlayer insulating layer 113, and the gate insulating layers 11 and 112.

According to an embodiment, the first connection electrode 163 is connected to the first upper gate electrode 151 through the third contact hole CNT3 that penetrates the upper interlayer insulating layer 115. The first connection electrode 163 is electrically connected to the first upper gate electrode 151 and lowers the resistance of the first upper gate electrode 151.

According to an embodiment, the first via layer 116 is disposed on the fourth conductive layer 160 and the upper interlayer insulating layer 115. The first via layer 116 may include an inorganic insulating material, or may include an organic insulating material such as polyacrylate resin, epoxy resin, phenolic resin, polyamide resin, polyimide rein, unsaturated polyester resin, polyphenylenether resin, polyphenylene sulfide resin, or benzocyclobutene (BCB). The first via layer 116 may be a single-layer film or a multi-layer film formed of stacked layers of materials that differ from each other.

According to an embodiment, a fifth conductive layer 170 is disposed on the first via layer 116. The fifth conductive layer 170 includes the second connection electrode 171. The fifth conductive layer 170 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), or copper (Cu). The fifth conductive layer 170 may be a single-layer film or a multi-layer film.

According to an embodiment, the second connection electrode 171 is connected to the second drain electrode 165 through a sixth contact hole CNT6 that partially penetrates the first via layer 116 and exposes the upper surface of the second drain electrode 165.

According to an embodiment, the second via layer 117 is formed on the fifth conductive layer 170 and the first via layer 116.

According to an embodiment, the anode electrode 181 is disposed on the second via layer 117. The anode electrode 181 is connected to the second connection electrode 171 through a contact hole that penetrates the second via layer 117.

According to an embodiment, a separate anode electrode 181 is disposed for each sub-pixel SP. The anode electrode 181 may be considered a pixel electrode.

According to an embodiment, the bank layer 118 is disposed on the anode electrode 181 and the second via layer 117. The bank layer 118 partially exposes the anode electrode 181.

The bank layer 118 may include an organic insulating material or an inorganic insulating material. For example, the bank layer 118 includes at least one of a photoresist, a polyimide resin, an acrylic resin, a silicon compound, or a polyacrylic resin.

According to an embodiment, the organic light emitting layer 182 is disposed in the opening of the bank layer 118 on the upper surface of the anode electrode 181. The cathode electrode 183 is disposed on the organic light emitting layer 182 and the bank layer 118. The cathode electrode 183 is a common electrode disposed over the plurality of sub pixels SP.

According to an embodiment, anode electrode 181, the organic light emitting layer 182, and the cathode electrode 183 constitute an organic light emitting element 180.

According to an embodiment, the encapsulation layer 190 is disposed on the cathode electrode 183. The encapsulation layer 190 covers the organic light emitting element 180. The encapsulation layer 190 is a stacked film in which inorganic films and organic films are alternately stacked. For example, the encapsulation layer 190 may include a first encapsulation inorganic film 191, an encapsulation organic film 192, and a second encapsulation inorganic film 193 that are sequentially stacked.

Hereinafter, the upper interlayer insulating layer 115 will be described in detail with reference to the graphs of FIGS. 6 to 20. When describing the graphs of FIGS. 6 to 20, the above-described FIGS. 1 to 5 are referred together.

Figure 6:
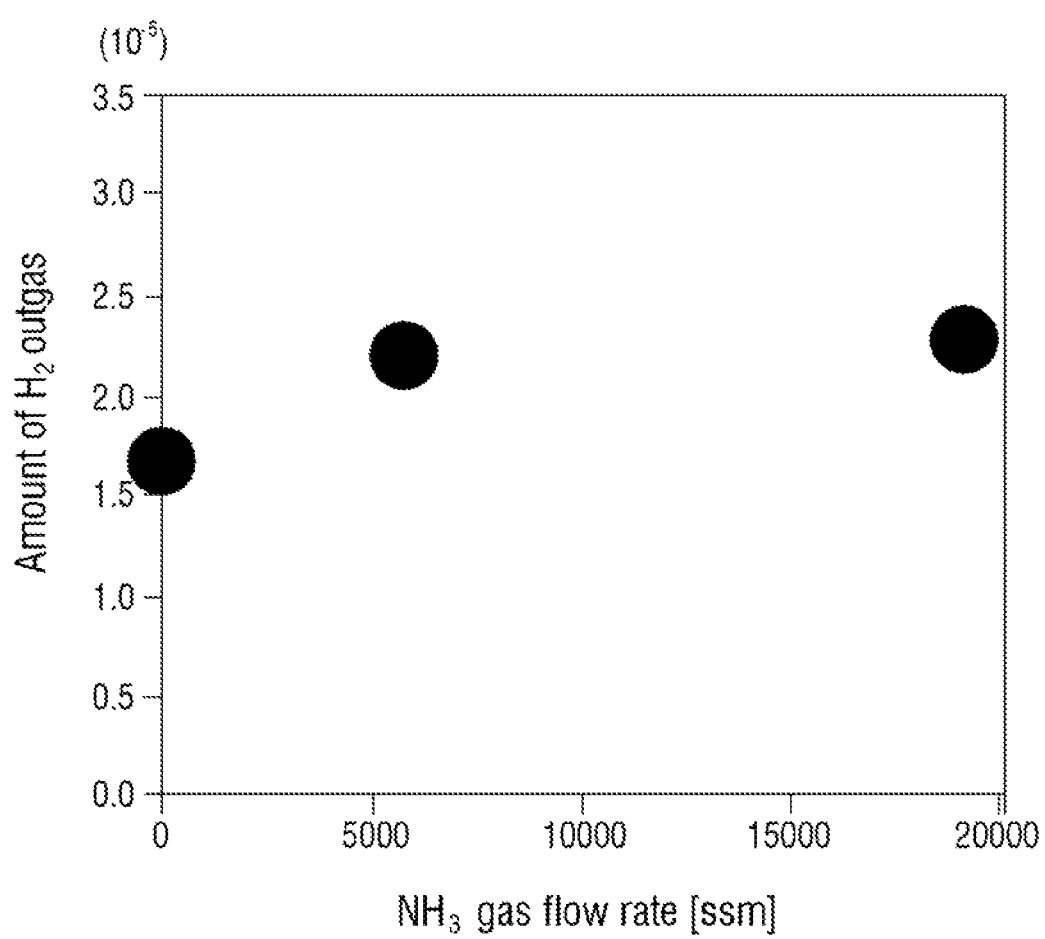
FIG. 6 is a graph of the discharge amount of hydrogen as a function of ammonium flow rate.

FIG. 6 is a graph of the discharge amount of hydrogen as a function of ammonium flow rate. The horizontal axis in FIG. 6 represents the $NH_3$ (ammonium) gas flow rate (sccm), and the vertical axis in FIG. 6 represents the $H_2$ (hydrogen) outgas amount ($10^{-5}$).

Referring to FIG. 6, according to an embodiment, it may be found that when forming an interlayer insulating layer that contains silicon nitride through chemical vapor deposition, the discharge amount of hydrogen is the least, about $1.5 \times 10^{-5}$, when the ammonium flow rate is 0 ($NH_3$ free), and the discharge amount of hydrogen increases to approximately $2.2*10^{-5}$ when the ammonium flow rate is 5000 and 19000. That is, it may be found that when forming an interlayer insulating layer that contains silicon nitride through chemical vapor deposition, the discharge amount of hydrogen, which can cause an increase in the threshold voltage of the oxide semiconductor layer 145, decreases as the ammonium flow rate decreases.

Figure 7:
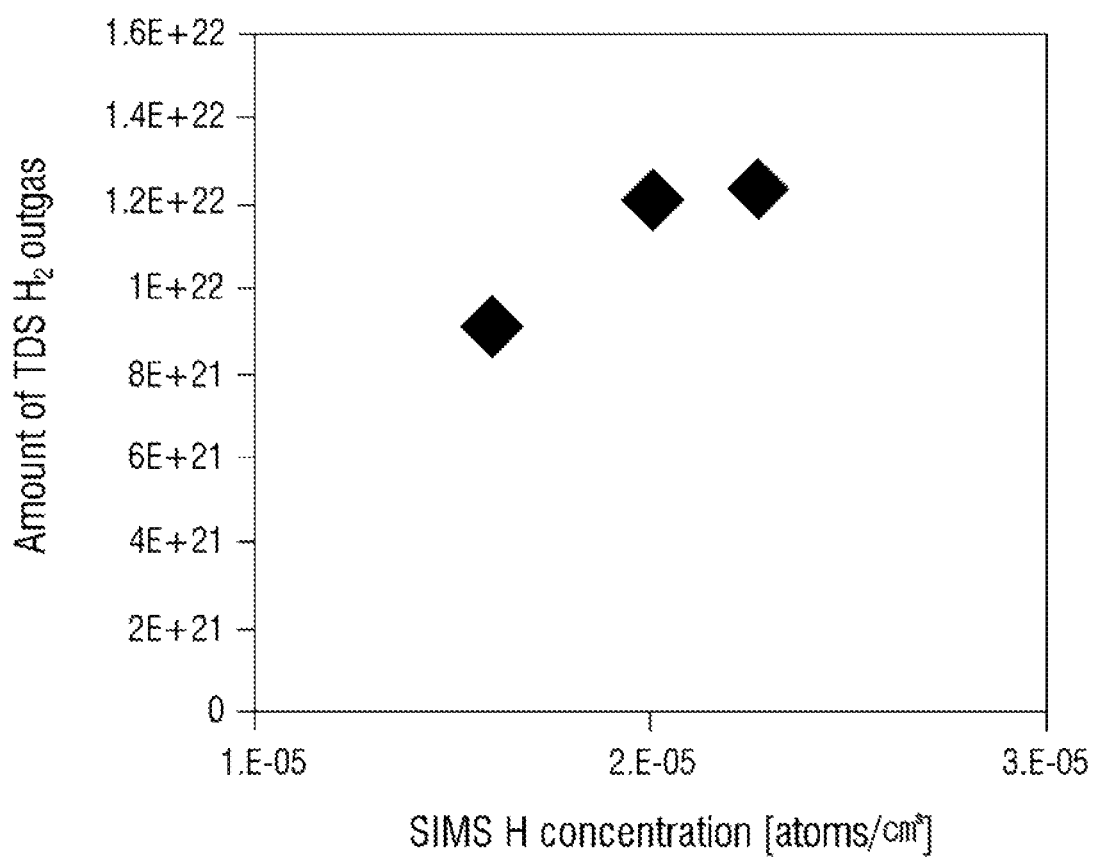
FIG. 7 is a graph of the discharge amount of hydrogen as a function of hydrogen concentration.

FIG. 7 is a graph of the discharge amount of hydrogen as a function of hydrogen concentration. The horizontal axis in FIG. 7 represents SIMS H concentration (atoms/cm$^3$), and the vertical axis in FIG. 7 represents TDS H2 outgas amount.

Referring to FIG. 7, it may be found that as the hydrogen concentration in the interlayer insulating layer that contains silicon nitride increases, the discharge amount of hydrogen actually increases. For example, it may be found that the discharge amount of hydrogen is about 9E+21 when the hydrogen concentration is about 1.5.E-05, and the discharge amount of hydrogen is about 1.2E+22 when the hydrogen concentration is about 2.E-05.

Figure 8:
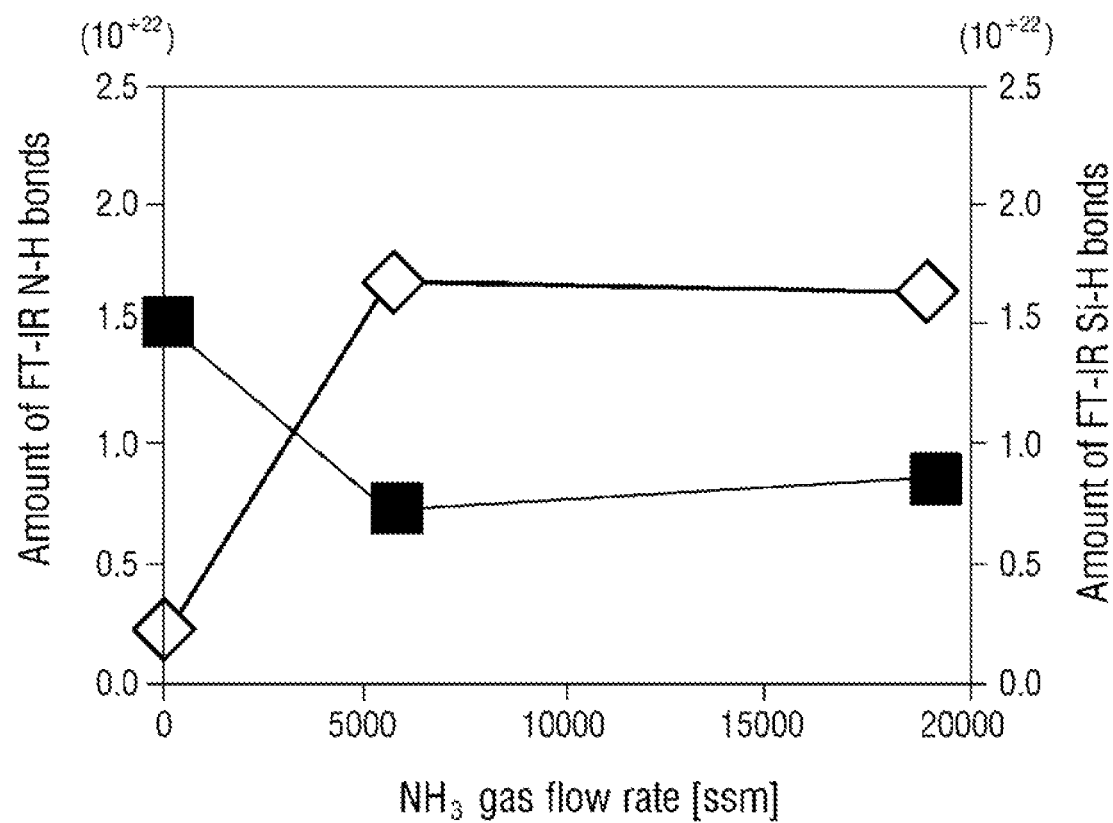
FIG. 8 is a graph of the amount of nitrogen-hydrogen bonds and the amount of silicon-hydrogen bonds as a function of ammonium flow rate.

FIG. 8 is a graph of the amount of nitrogen-hydrogen bonds and the amount of silicon-hydrogen bonds as a function of ammonium flow rate. The horizontal axis in FIG. 8 represents $NH_3$ gas flow rate (sccm), and the vertical axes in FIG. 8 represent the amount ($10^{+22}$) of FT-IR N—H bonds and the amount ($10^{+22}$) of FT-IR Si—H bonds respectively.

Referring to FIG. 8, it may be found that when forming a silicon nitride containing interlayer insulating layer through chemical vapor deposition, the amount of N—H bonds increases and the amount of Si—H bonds decreases as the ammonium flow rate increases, and the amount of N—H bonds decreases and the amount of Si—H bonds increases as the ammonium flow rate decreases. For example, it may be found that the amount of N—H bonds is about $0.25 \times 10^{+22}$ and the amount of Si—H bonds is about $1.5 \times 10^{+22}$ when the ammonium flow rate is 0 ($NH_3$ free), that the amount of N—H bonds is about $1.6 \times 10^{+22}$ and the amount of Si—H bonds is about $0.7 \times 10^{+22}$ when the ammonium flow rate is about 5000, and that the amount of N—H bonds is about $1.6 \times 10^{+22}$ and the amount of Si—H bonds is about $0.75 \times 10^{+22}$ when the ammonium flow rate is about 19000. Since the discharge amount of hydrogen increases as the amount of N—H bonds in the silicon nitride containing interlayer insulating layer increases, a method of decreasing the ammonium flow rate used may be used in a chemical vapor deposition process that forms an interlayer insulating layer that contains silicon nitride. On the other hand, the discharge amount of hydrogen tends to decrease as the amount of Si—H bonds in the silicon nitride containing interlayer insulating layer increases, but defects in film quality may occur. The defects in film quality can cause current leakage. Moreover, even when the amount of Si—H bonds continuously increases by reducing the ammonium flow rate, the discharge amount of hydrogen might not decrease because the Si—H bond force is relatively weaker than the N—H bond force. Therefore, in a chemical vapor deposition process that forms the second interlayer insulating layer 115b, an appropriate N—H bond amount and an appropriate Si—H bond amount may be obtained by using an ammonium flow rate from about 4000 to about 6000.

Figure 9:
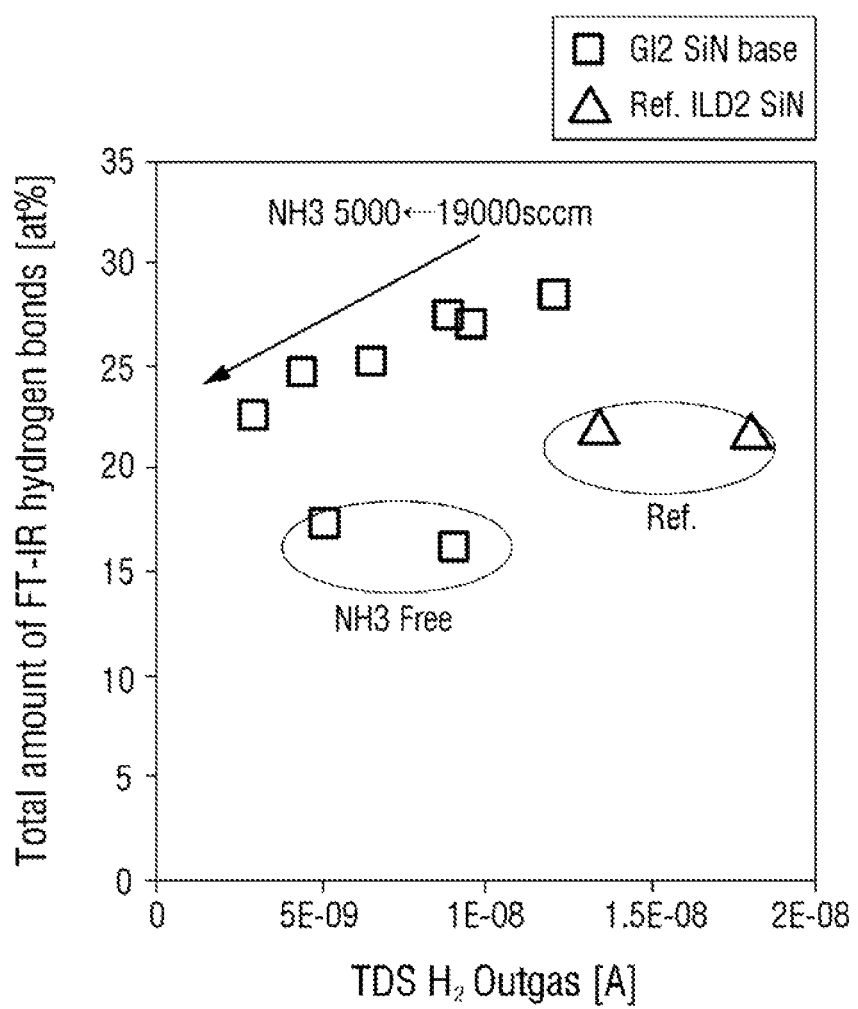
FIG. 9 is a graph of the total amount of hydrogen bonds as a function of the discharge amount of hydrogen.

FIG. 9 is a graph of the total amount of hydrogen bonds as a function of the discharge amount of hydrogen. The horizontal axis in FIG. 9 represents TDS H2 Outgas (A), and the vertical axis in FIG. 9 represents the amount (at %) of FT-IR Total hydrogen bonds. The samples marked with squares in FIG. 9 represent SiN bases formed through a chemical vapor deposition process that uses different ammonium flow rates.

Referring to FIG. 9, it may be found that as the ammonium flow rate changes from 19000 to 5000, the amount of hydrogen bonds gradually decreases from 29 to 22, and thus the discharge amount of hydrogen also decreases. It may be found that when the ammonium flow rate is 5000, the discharge amount of hydrogen is less than the discharge amount of hydrogen when the ammonium flow rate is 0 ($NH_3$ Free). This may be due to the fact that even when the amount of Si—H bonds continuously increases by decreasing the ammonium flow rate as described above with regard to FIG. 8, the discharge amount of hydrogen does not continuously decrease because the Si—H bond force is relatively weaker than the N—H bond force. Accordingly, in a chemical vapor deposition process that forms the second interlayer insulating layer 115b, an ammonium flow rate of about 4000 to about 6000 is used, which reduces the discharge amount of hydrogen.

Figure 10:
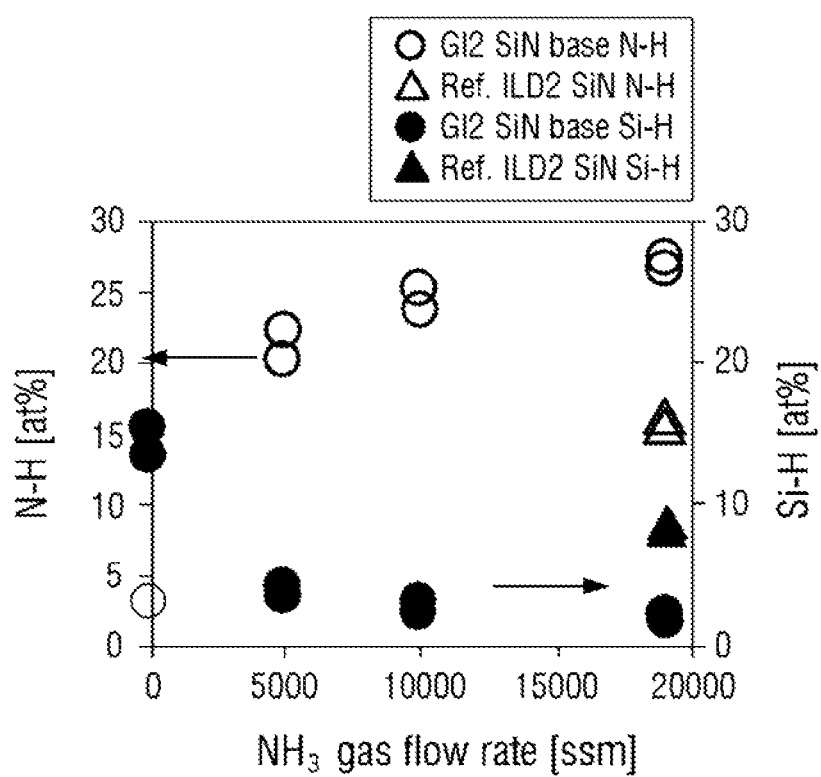
FIG. 10 is a graph of the ratio of nitrogen-hydrogen bonds and the ratio of silicon-hydrogen bonds as a function of to ammonium flow rate.

FIG. 10 is a graph of the ratio of nitrogen-hydrogen bonds and the ratio of silicon-hydrogen bonds as a function of ammonium flow rate. The horizontal axis in FIG. 10 represents NH3 flow rate (sccm), and the vertical axes in FIG. 10 represent N—H (at %) and Si—H (at %), respectively. The hollow circle mark, hereinafter referred to as the first mark, represents the N—H (%) of the silicon nitride containing interlayer insulating layer, and the solid circle mark, hereinafter referred to as the second mark, represents Si—H (%) of the silicon nitride containing interlayer insulating layer.

Referring to FIG. 10, it may be found that the ratio of N—H bonds increases and the ratio of Si—H bonds decreases as the ammonium flow rate increases, and the ratio of N—H bonds decreases and the ratio of Si—H bonds increases as the ammonium flow rate decreases. FIG. 8 illustrates the amount of N—H bonds and the amount of Si—H bonds as a function of the ammonium flow rate, whereas FIG. 10 illustrates the ratio of nitrogen-hydrogen bonds and the ratio of silicon-hydrogen bonds as a function of ammonium flow rate.

Figure 11:
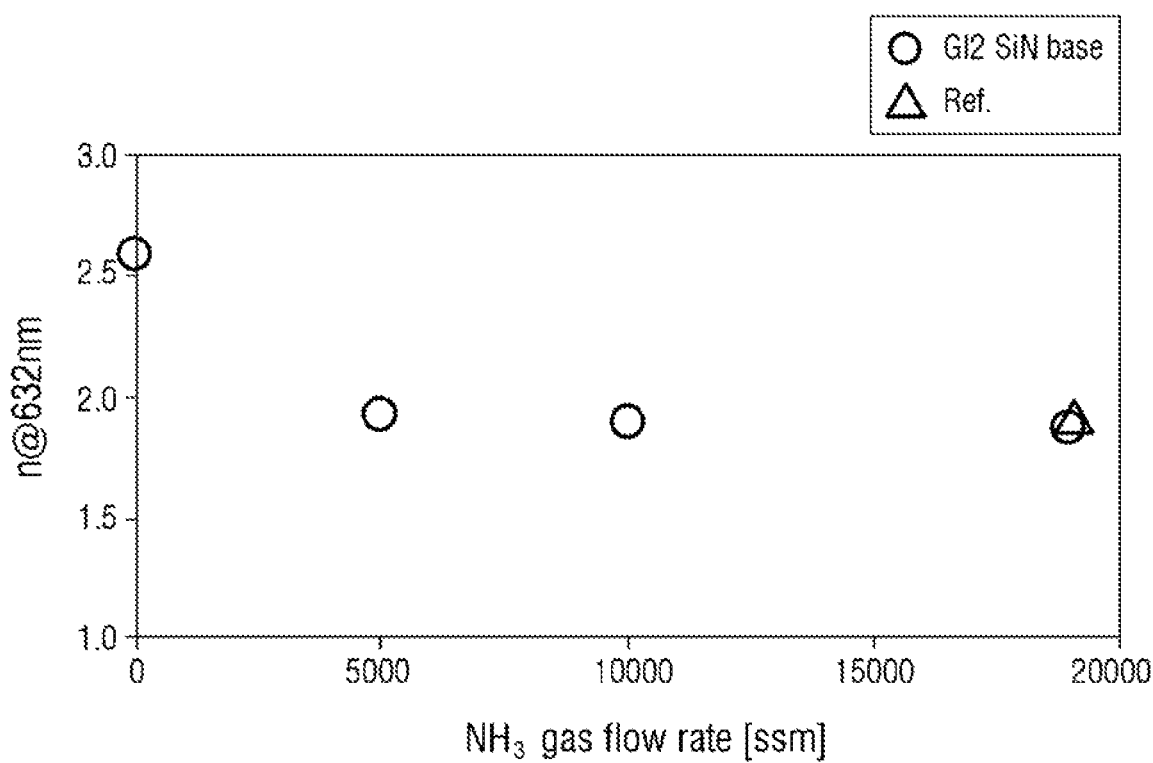
FIG. 11 is a graph of the refractive index as a function of ammonium flow rate.

FIG. 11 is a graph of the refractive index according to ammonium flow rate. The horizontal axis in FIG. 11 represents $NH_3$ flow rate (sccm), and the vertical axis in FIG. 11 represents refractive index (n) at about 632 nm. The circle mark indicates a first sample of the silicon nitride containing interlayer insulating layer when the ammonium flow rate is 5000, and the triangle mark indicates a second sample of an silicon nitride containing interlayer insulating layer formed through a conventional chemical vapor deposition process that uses an ammonium flow rate of about 19000.

Referring to FIG. 11, it may be found that the second sample has a refractive index of about 1.9, and that the first sample has a refractive index of about 2.6 when the ammonium flow rate is 0 ($NH_3$ free). Further, it may be found that the first sample has the same refractive index as the second sample when the ammonium flow rates are 5000, 10000, and 19000 under different process conditions from the second sample, such as process pressure, and temperature.

Figure 12:
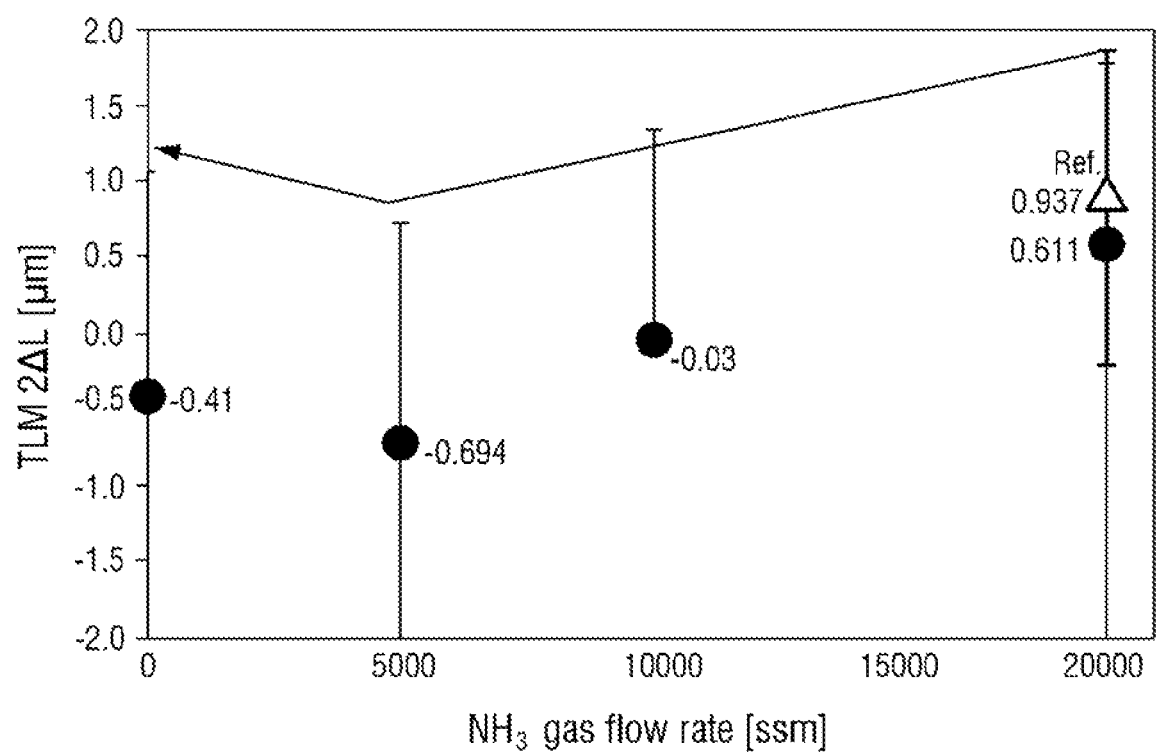
FIG. 12 is a graph of the change of a channel region as a function of ammonium flow rate.

FIG. 12 is a graph of the change of a channel region as a function of ammonium flow rate. The horizontal axis in FIG. 12 represents $NH_3$ flow rate (sccm), and the vertical axis in FIG. 12 represents TLM 2ΔL (μm). The circle mark indicates a first sample of the silicon nitride containing interlayer insulating layer when the ammonium flow rate is 5000, and the triangle mark indicates a second sample of a silicon nitride containing interlayer insulating layer formed through a conventional chemical vapor deposition process using an ammonium flow rate of about 19000. Let L represent a length of the oxide semiconductor layer 145, and in FIG. 4, L represents a length of the first channel region of the oxide semiconductor layer 145. When ΔL is 0, the first channel region of the oxide semiconductor layer 145 has the same length as the overlying first upper gate electrode 151, when ΔL has a positive value, the length of the first channel region of the oxide semiconductor layer 145 is decreased as compared with the length of the first upper gate electrode 151, and when ΔL has a negative value, the length of the first channel region of the oxide semiconductor layer 145 is increased as compared with the length of the first upper gate electrode 151.

Referring to FIG. 12, it may be found that in the first sample, as the ammonium flow rate decreases, the length of the first channel region generally increases by about 0.3 when the ammonium flow rate is 19000, by about 0 when the ammonium flow rate is 10,000, and by about −0.694 when the ammonium flow rate is about 5000, but when the ammonium flow rate is 0 ($NH_3$ free), the length of the first channel region decreases by about −0.41. It may be found that in the second sample, the length of the first channel region is about 0.937, which decreases. Accordingly, when forming the second interlayer insulating layer 115b through a chemical vapor deposition process, when an ammonium flow rate is of about 5000, a short between the first source region and the first drain region may be prevented by increasing the length of the first channel region.

Figure 13:
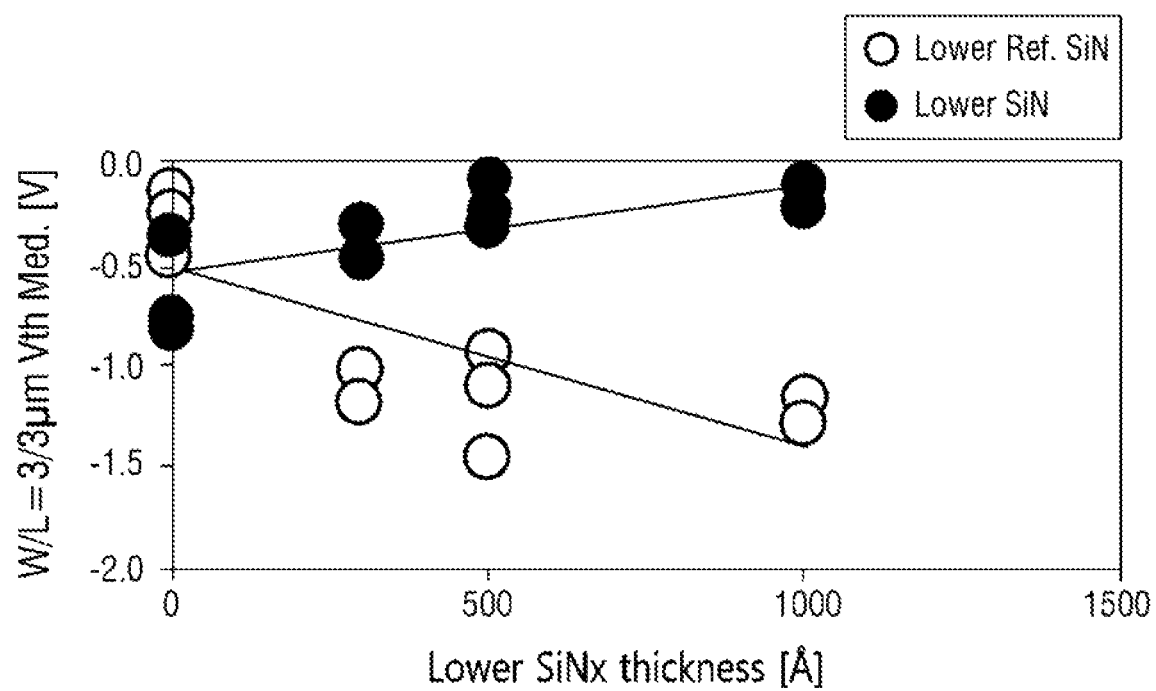
FIG. 13 is a graph of the threshold voltage as a function of the thickness of an interlayer insulating layer that contains silicon nitride.

FIG. 13 is a graph of the threshold voltage as a function of the thickness of a silicon nitride containing interlayer insulating layer. In FIG. 13, the horizontal axis represents the lower SiNx thickness (Å), and the vertical axis represents a Vth Med (V) at W/L=3/3 μm. The solid circle mark represents a first sample of the silicon nitride containing interlayer insulating layer when the ammonium flow rate is 5000, and the hollow circle mark represents the second sample of the silicon nitride containing interlayer insulating layer formed through a conventional chemical vapor deposition process that uses an ammonium flow rate of about 19000.

Referring to FIG. 13, it may be found that in the second sample, the threshold voltage Vth decreases, i.e. is negatively shifted, as the thickness increases, and in the first sample, the threshold voltage Vth increases, i.e. is positively shifted, as the thickness increases. When the thickness is 0, the threshold voltage is −0.7, and when the thickness is 300, the threshold voltage is −0.5. However, it may be found that in the first sample, when the thickness is 300 Å or greater, e.g., 300, 500, or 1000 Å, the threshold voltage (Vth) is almost unchanged and has a constant value (−0.5). Accordingly, it may be found that when the thickness of the second upper interlayer insulating layer 115b is about 300 Å or greater, the threshold voltage Vth can be reliably increased.

Figure 14:
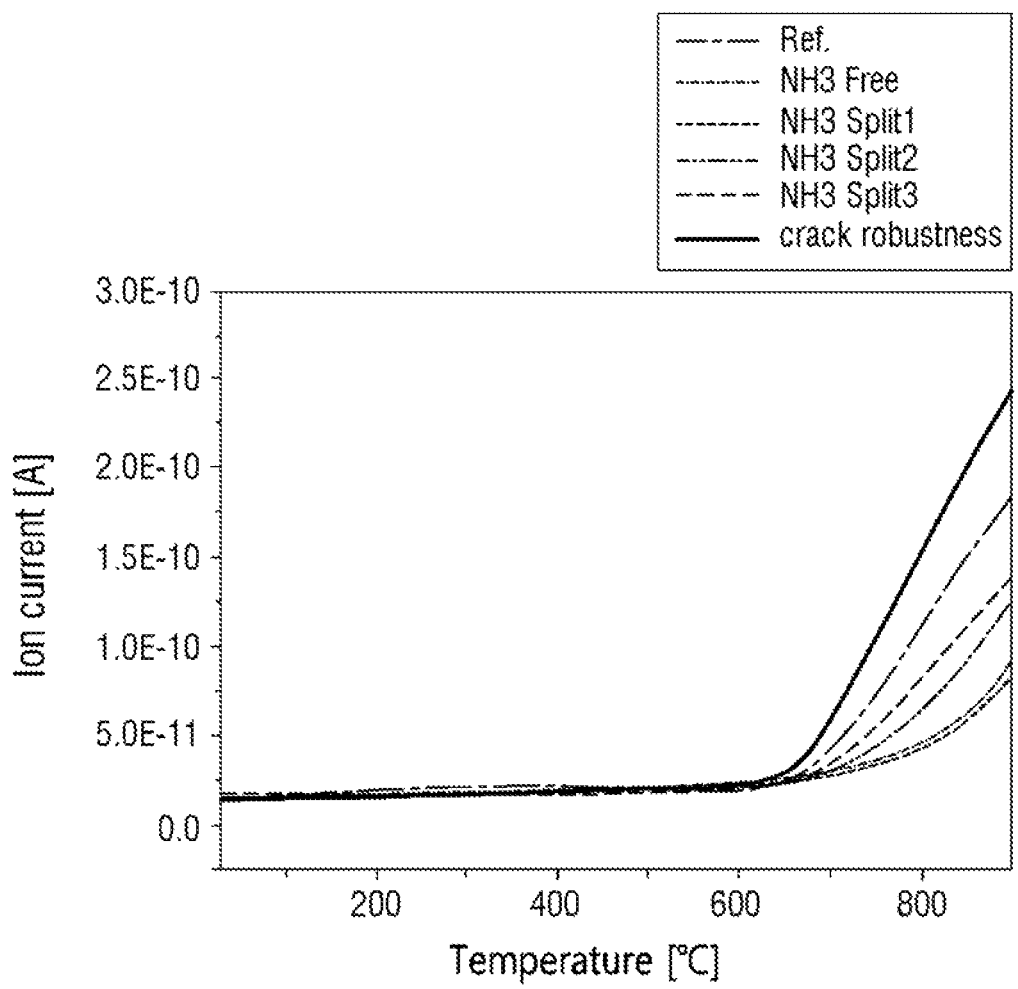
FIG. 14 is a graph of the ion current at central portion as a function of temperature.
Figure 15:
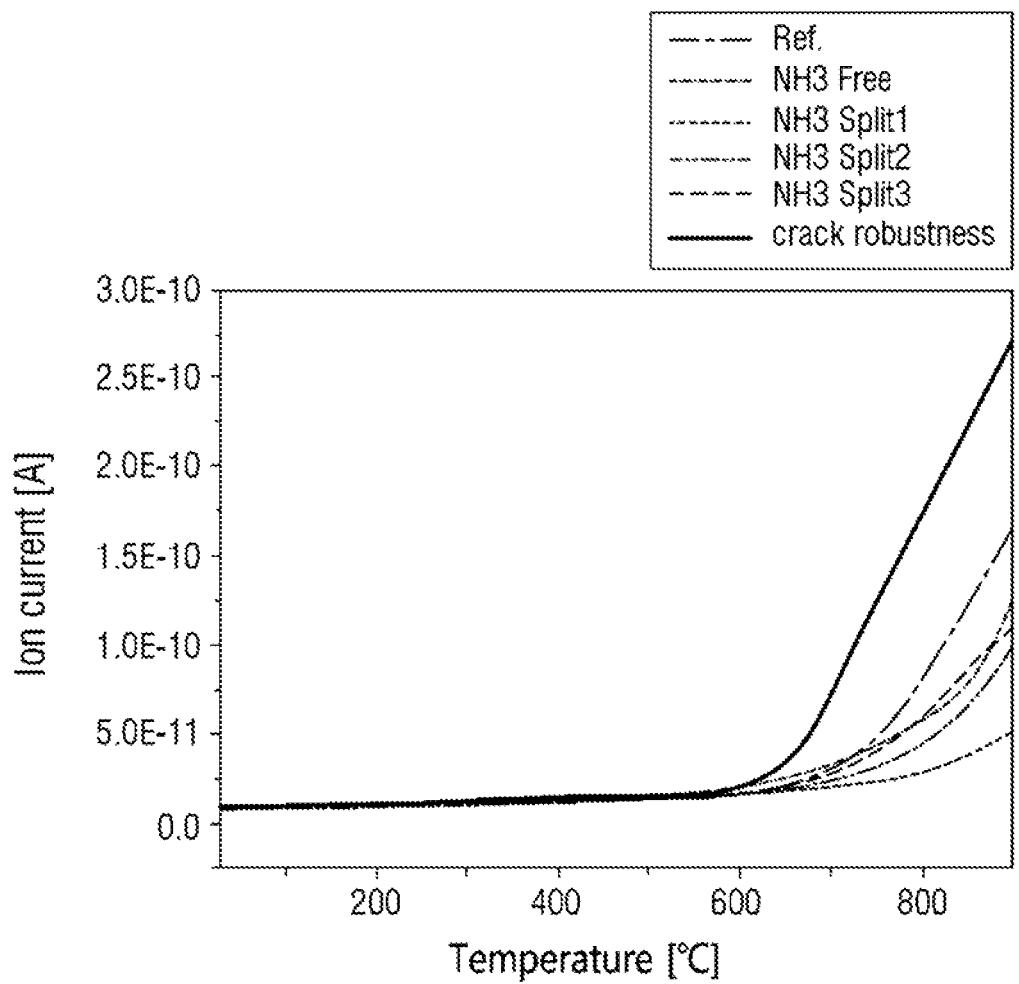
FIG. 15 is a graph of the ion current at the peripheral portion as a function of temperature.

FIG. 14 is a graph of the ion current at the central portion as a function of temperature, and FIG. 15 is a graph illustrating the ion current in the peripheral portion as a function of temperature. In FIGS. 14 and 15, the horizontal axis represents temperature (° C.), and the vertical axis represents ion current (A). In the figure, Ref refers to the first sample of a silicon nitride containing interlayer insulating layer formed through a conventional chemical vapor deposition process that uses an ammonium flow rate of about 19000, $NH_3$ Free refers to the second sample of a silicon nitride containing interlayer insulating layer formed through a conventional chemical vapor deposition process that uses an ammonium flow rate of 0, $NH_3$ Split 1 refers to the third sample of a silicon nitride containing interlayer insulating layer formed through a chemical vapor deposition process that uses an ammonium flow rate of 5000, $NH_3$ Split 2 refers to the fourth sample of a silicon nitride containing interlayer insulating layer formed through a chemical vapor deposition process that uses an ammonium flow rate of 10000, NH, Split 3 refers to the fifth sample of a silicon nitride containing interlayer insulating layer formed through a chemical vapor deposition process that uses an ammonium flow rate of 15000, and crack robustness refers to the sixth sample of a silicon nitride containing interlayer insulating layer formed through a chemical vapor deposition process that uses an ammonium flow rate of 19000 under process conditions that differ from Sample 1, for example, process pressure and temperature.

FIGS. 14 and 15 illustrate cases where ion currents are measured at the central portions (Center) of the samples and the peripheral portions (Edge) of the samples, respectively.

Referring to FIGS. 14 and 15, it may be found that for the second to fifth samples, the ion current thereof at about 600° C. is less than the ion current of the first sample 1. In contrast, it may be found that for the sixth sample, the ion current thereof at about 600° C. as is greater than the ion current of the first sample 1.

Figure 16:
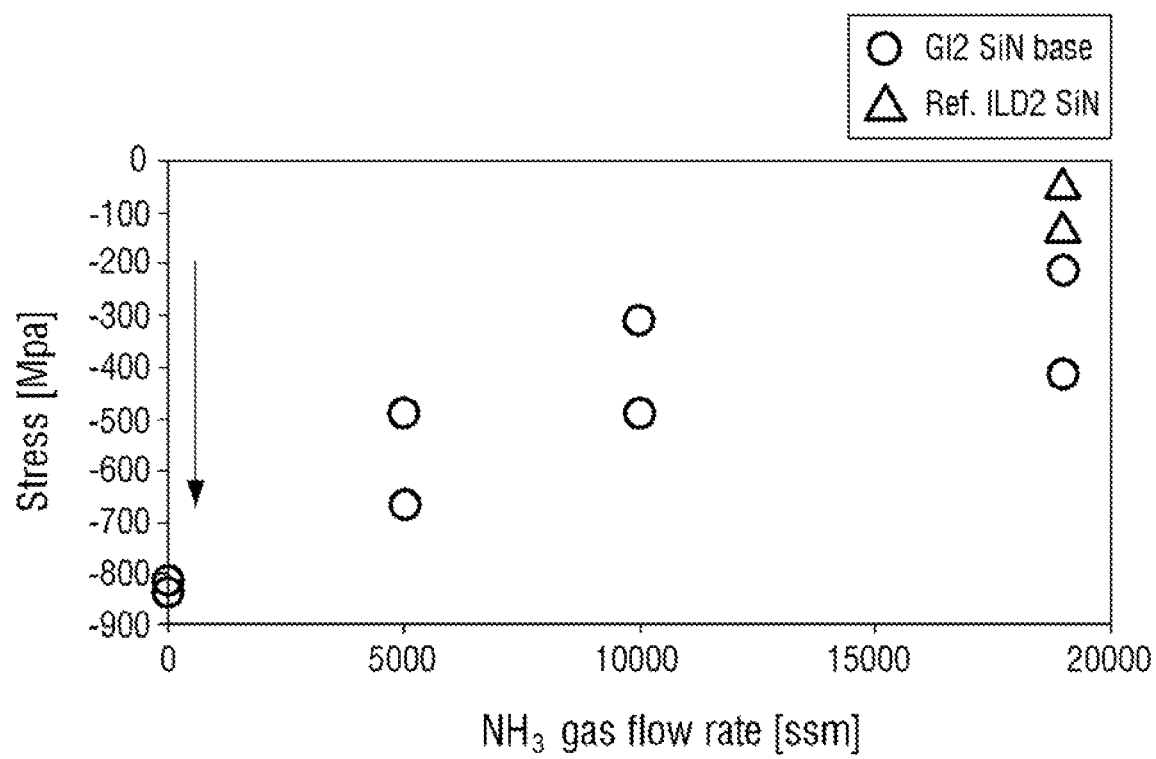
FIG. 16 is a graph of the stress as a function of ammonium flow rate.

FIG. 16 is a graph of the stress as a function of ammonium flow rate. The horizontal axis in FIG. 16 represents $NH_3$ flow rate (sccm), and the vertical axis represents stress (Mpa). The circle mark indicates a first sample of the silicon nitride containing interlayer insulating layer when the ammonium flow rate is 5000, and the triangle mark indicates a second sample of the silicon nitride containing interlayer insulating layer formed through a conventional chemical vapor deposition process that uses an ammonium flow rate of about 19000. As the stress becomes negative, the compressive stress value increases. As the compressive stress of the interlayer insulating layer increases, warpage of the base substrate 101 increases, and thus deposition defects may occur in subsequent processes, such as organic material deposition.

Referring to FIG. 16, it may be found that in the case of the second sample, the stress thereof is about −100, and in the case of the first sample, the stress thereof decreases, from about −250 to −350, about −300 to −500, about −500 to −700, and about −820, as the ammonium flow rate decreases from 19000 to 0. Thus, it may be found that the number of Si—H bonds in the interlayer insulating layer decreases as the ammonium flow rate decreases, and in this case, the Si—H bonds cause the stress to decrease. Accordingly, the upper interlayer insulating layers 115b and 115c have the appropriate compressive stress that does not cause deposition defects due to the warpage of the base substrate 101, and the upper interlayer insulating layers 115b and 115c according to an embodiment are deposited using ammonium having a flow rate of about 5000 or greater.

Figure 17:
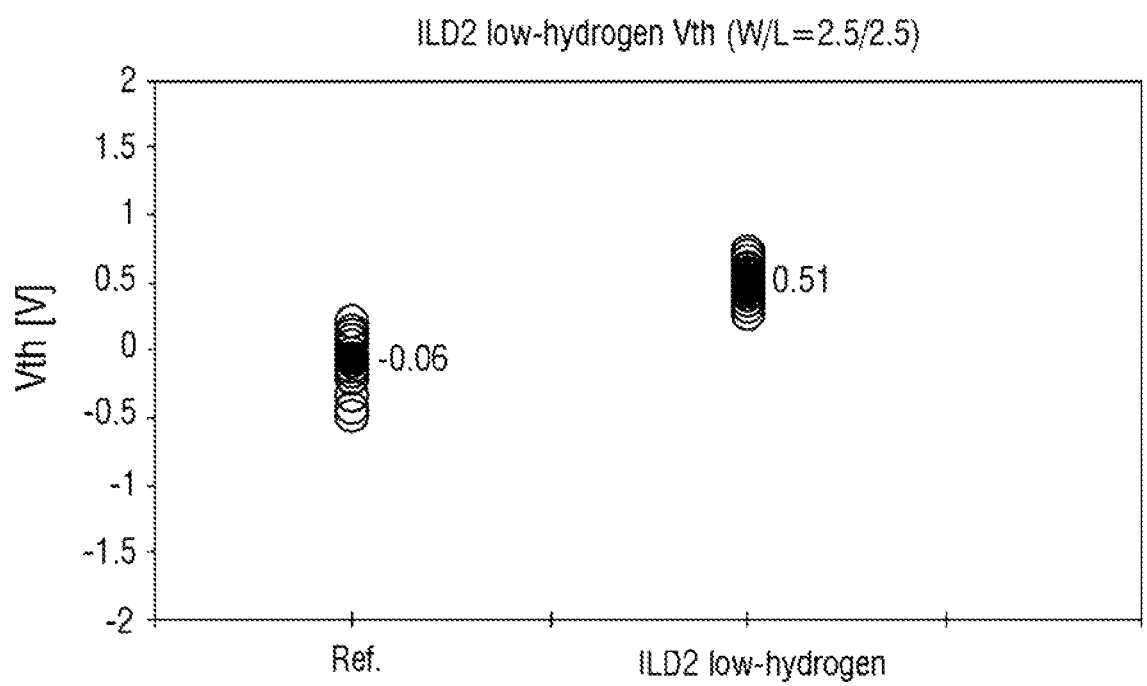
FIG. 17 is a graph of the threshold voltage as a function of hydrogen concentration.
Figure 18:
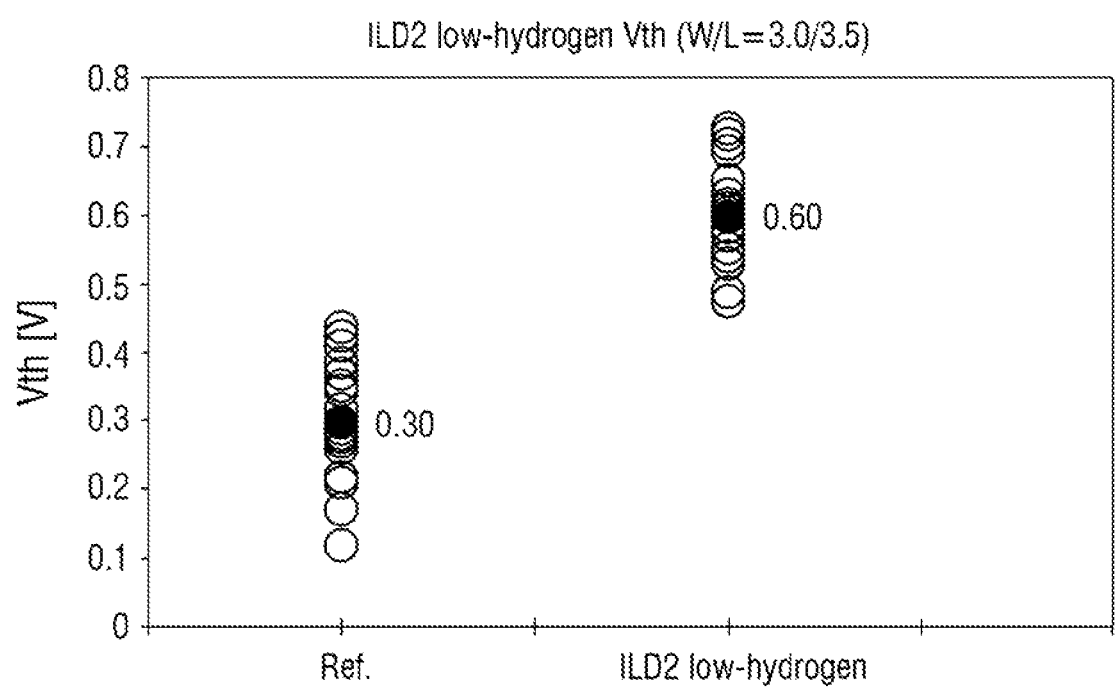
FIG. 18 is a graph of the threshold voltage as a function of hydrogen concentration.

FIG. 17 is a graph of the threshold voltage as a function of hydrogen concentration, and FIG. 18 is a graph of the threshold voltage as a function of hydrogen concentration.

In FIGS. 17 and 18, the horizontal axis represents the first sample, ILD2 Hydrogen, which is the silicon nitride containing interlayer insulating layer 115b formed by a chemical vapor deposition process that uses an ammonium flow rate of 5000, 10000, or 15000, and the second sample, Ref, which is the silicon nitride containing interlayer insulating layer formed through a conventional chemical vapor deposition process that uses an ammonium flow rate of about 19000, and the vertical axis represents threshold voltage Vth (V). FIG. 17 illustrates a case where the width (W)/length (L) of the oxide semiconductor layer 145 is 2.5/2.5, and FIG. 18 illustrates a case where the width (W)/length (L) of the oxide semiconductor layer 145 is 3.0/3.5.

Referring to FIGS. 17 and 18, it may be found that the threshold voltage of the first sample increases as compared with the threshold voltage of the second sample. For example, FIG. 17 shows that the threshold voltage of the first sample is −0.06, and FIG. 18 shows that the threshold voltage of the first sample is 0.3. In contrast, FIG. 17 shows that the threshold voltage of the second sample is 0.51, and FIG. 18 shows that the threshold voltage of the second sample is 0.6.

Figure 19:
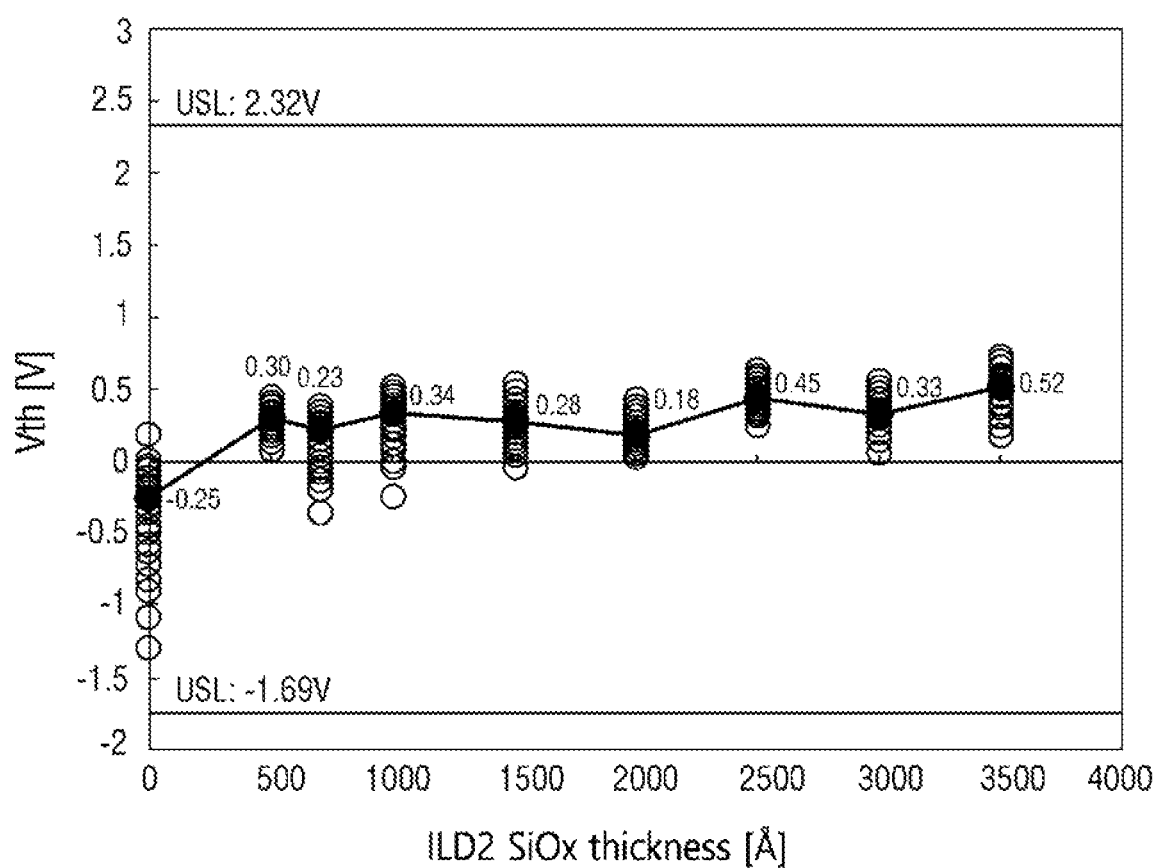
FIG. 19 is a graph of the threshold voltage as a function of the thickness of an interlayer insulating layer that contains silicon nitride.

FIG. 19 is a graph of the threshold voltage as a function of the thickness of a silicon oxide containing interlayer insulating layer. The horizontal axis in FIG. 19 represents ILD2 SiOx thickness (Å), and the vertical axis represents threshold voltage Vth (V).

Referring to FIG. 19, it may be found that when the thickness of an interlayer insulating layer that contains silicon oxide is 500 Å or greater, the threshold voltage thereof has a positive value compared to when the thickness of the silicon oxide containing interlayer insulating layer is 0 Å. Accordingly, in terms of threshold voltage, the thickness of the first upper interlayer insulating layer 115a of the upper interlayer insulating layer 115 according to an embodiment, which contains silicon oxide, is maintained at a value of 500 Å or greater.

Figure 20:
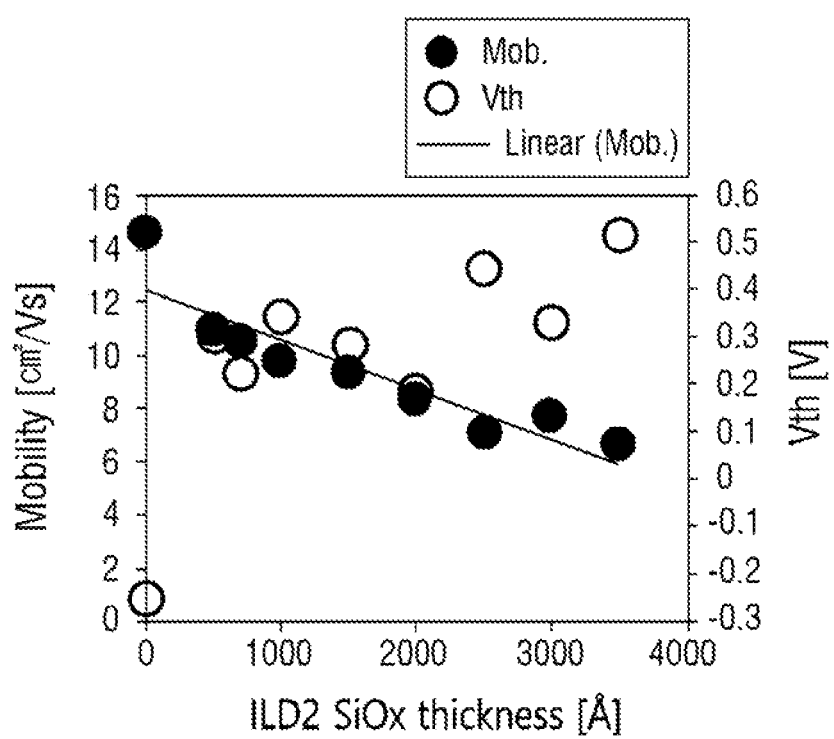
FIG. 20 is a graph of the mobility and threshold voltage as a function of the thickness of an interlayer insulating layer that contains silicon nitride.

FIG. 20 is a graph of the mobility and threshold voltage as a function of the thickness of a silicon nitride containing interlayer insulating layer. In FIG. 20, the horizontal axis represents ILD2 SiOx thickness (Å), and the vertical axes represent threshold voltage Vth (V) and mobility (cm2/Vs), respectively.

Referring to FIG. 20, it may be found that as the thickness of the silicon oxide containing interlayer insulating layer increases, the mobility thereof decreases, and the threshold voltage thereof increases. In contrast, it may be found that as the thickness of the silicon oxide containing interlayer insulating layer decreases, the mobility thereof increases, and the threshold voltage thereof decreases. It may be found that when the thickness of the silicon oxide containing interlayer insulating layer is 500 Å or greater, the threshold voltage increases from −0.25 to 0.15 as compared to when the thickness of the silicon oxide containing interlayer insulating layer is 0 Å. Accordingly, in terms of threshold voltage, the thickness of the first upper interlayer insulating layer 115a of the upper interlayer insulating layer 115 according to an embodiment is maintained at a value of 500 Å or greater.

Hereinafter, a method of manufacturing a display device according to an embodiment will be described. In the following embodiments, the same components as those of the embodiment already described may be referred to by the same reference numerals, and descriptions thereof are omitted or simplified.

Figure 21:
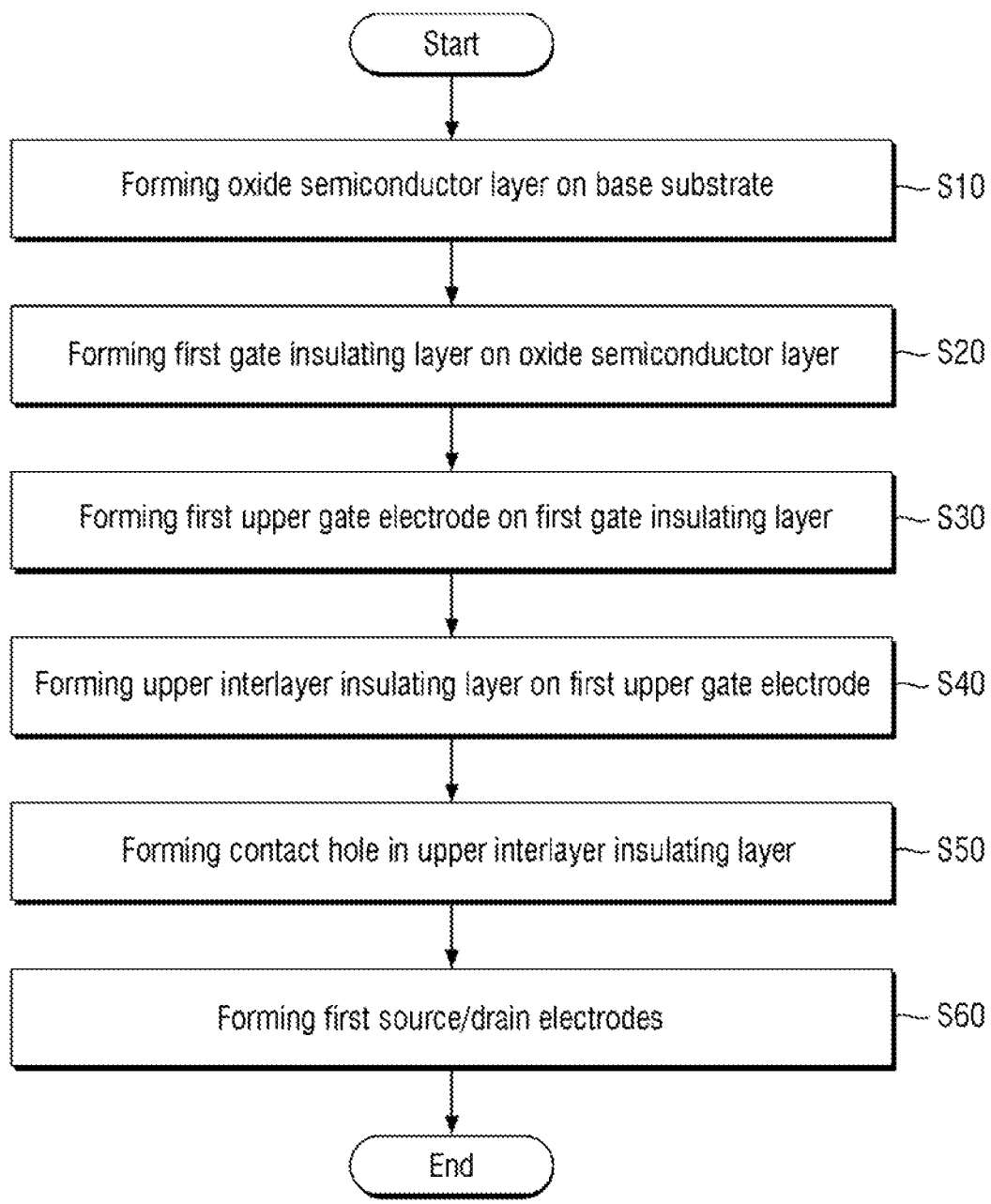
FIG. 21 is a flowchart of a method of manufacturing a display device according to an embodiment.

FIG. 21 is a flowchart of a method of manufacturing a display device according to an embodiment. The method of manufacturing a display device according to an embodiment will be described with reference to FIGS. 4 and 4.

Referring to FIGS. 4 and 21, according to an embodiment, an oxide semiconductor layer 145 is formed on a base substrate 101 (S10). Before forming the oxide semiconductor layer 145 on the base substrate 101, the method may further include a step of sequentially stacking a barrier layer 102 on the base substrate 101, a buffer layer 103 on the barrier layer 102, a polycrystalline silicon semiconductor layer 105 on the buffer layer 103, a lower gate insulating layer 111 on the polycrystalline silicon semiconductor layer 105, a second gate electrode 121 on the lower gate insulating layer 111, an upper gate insulating layer 112 on the second gate electrode 121, a first lower gate electrode 131 and a capacitor electrode 133 on the upper gate insulating layer 112, and a lower interlayer insulating layer 113 on the first lower gate electrode 131 and the capacitor electrode 133.

According to an embodiment, the oxide semiconductor layer 145 includes an oxide. The oxide may include G-I-Z-O, or an oxide of at least one of zinc (Zn), indium (In), gallium (Ga), tin (Sn) cadmium (Cd), germanium (Ge), or hafnium (Hf), or a combination thereof. The oxide includes at least one of indium-gallium-zinc oxide (IGZO, indium gallium zinc oxide), zinc-tin oxide (ZTO), or indium tin oxide (IZO).

According to an embodiment, first channel region of the oxide semiconductor layer 145 overlaps the underlying lower first lower gate electrode 131.

Subsequently, according to an embodiment, a first gate insulating layer 114 is formed on the oxide semiconductor layer 145 (S20). The first gate insulating layer 114 overlaps the first channel region of the oxide semiconductor layer 145, but does not overlap the first source region and first drain region thereof. The first gate insulating layer 114 deposited on the entire oxide semiconductor layer 145 and exposed and developed using a photoresist as a mask so as to overlap the first channel region of the oxide semiconductor layer 145.

Since the material of the first gate insulating layer 114 has been described above with reference to FIG. 4, a duplicate description thereof will be omitted.

Subsequently, according to an embodiment, a first upper gate electrode 151 is formed on the first gate insulating layer 114 (S30).

According to an embodiment, the first upper gate electrode 151 overlaps the first gate insulating layer 114. For example, after a first upper gate electrode material is deposited on the first gate insulating layer 114, the first upper gate electrode 151 that overlaps the first channel region of the oxide semiconductor layer 145 is formed using the photoresist as a mask.

As described above, according to an embodiment, the first gate insulating layer 114 and the first upper gate electrode 151 cover the first channel region of the oxide semiconductor layer 145, and exposes the upper surfaces of the first source region and first drain region of the oxide semiconductor layer 145, respectively. Moreover, the side surfaces of the first gate insulating layer 114, and the side surfaces and upper surface of the first upper gate electrode 151 are exposed.

Since the first upper gate electrode material has been described above with reference to FIG. 4, a duplicate description thereof will be omitted.

Subsequently, according to an embodiment, the upper interlayer insulating layer 115 is formed on the first upper gate electrode 151 (S40). The upper interlayer insulating layer 115 covers and directly contacts the upper and side surfaces of the first source region of the oxide semiconductor layer 145, the upper and side surfaces of the first drain region of the oxide semiconductor layer 145, the side surfaces of the first gate insulating layer 114, the side surfaces and upper surface of the first upper gate electrode 151, and the upper surfaces of the lower interlayer insulating layer 113.

According to an embodiment, the step S40 of forming the upper interlayer insulating layer 115 includes the steps of: first forming a first upper interlayer insulating layer 115a on the first upper gate electrode 151; forming a second upper interlayer insulating layer 115b on the first upper interlayer insulating layer 115a; and forming a third upper interlayer insulating layer 115c on the second upper interlayer insulating layer 115b.

According to an embodiment, the first upper interlayer insulating layer 115a covers and directly contacts the upper and side surfaces of the first source region of the oxide semiconductor layer 145, the upper and side surfaces of the first drain region of the oxide semiconductor layer 145, the side surfaces of the first gate insulating layer 114, and the side surfaces and upper surface of the first upper gate electrode 151.

According to an embodiment, the first upper interlayer insulating layer 115a includes silicon oxide.

According to an embodiment, the first upper interlayer insulating layer 115a is formed using chemical vapor deposition. In a chemical vapor deposition process that forms the first upper interlayer insulating layer 115a, silane ($SiH_4$) and oxygen ($O_2$) are used. The hydrogen concentration in the first upper interlayer insulating layer 115a is less than the hydrogen concentration in each of the second upper interlayer insulating layer 115b and the third upper interlayer insulating layer 115c.

According to an embodiment, the first upper interlayer insulating layer 115a has a thickness of about 500 Å or greater. As found in the graph of FIG. 19, when the thickness of the first upper interlayer insulating layer 115a is about 500 Å or greater, the threshold voltage thereof has a positive value as compared to when the thickness thereof is about 0 Å.

According to an embodiment, the second upper interlayer insulating layer 115b is formed on the first upper interlayer insulating layer 115a.

According to an embodiment, the second upper interlayer insulating layer 115b, like the first upper interlayer insulating layer 115a, is formed using chemical vapor deposition. In a chemical vapor deposition process that forms the second upper interlayer insulating layer 115b, silane ($SiH_4$), ammonium ($NH_3$), etc., are used.

According to an embodiment, the third upper interlayer insulating layer 115c is formed on the second upper interlayer insulating layer 115b. In a chemical vapor deposition process that forms the third upper interlayer insulating layer 115c, silane ($SiH_4$), ammonium ($NH_3$), etc., are used.

According to an embodiment, each of the second upper interlayer insulating layer 115b and the third upper interlayer insulating layer 115c includes silicon nitride.

According to an embodiment, the hydrogen concentration in the second upper interlayer insulating layer 115b is less than the hydrogen concentration in the third upper interlayer insulating layer 115c. The reason for this is that when forming the second upper interlayer insulating layer 115b using chemical vapor deposition, a difference in hydrogen concentration between the upper interlayer insulating layers 115b and 115c further decreases the ammonium ($NH_3$) flow rate as compared to when forming the third upper interlayer insulating layer 115c using chemical vapor deposition.

In an embodiment, the second upper interlayer insulating layer 115b is formed using ammonium at a flow rate of about 4000 cc to 6000 cc, and the third upper interlayer insulating layer 115c is formed using ammonium at a flow rate of about 19000 cc or greater.

In some embodiments, the second upper interlayer insulating layer 115b is formed using ammonium at a flow rate of about 9000 cc to 11000 cc, and the third upper interlayer insulating layer 115c is formed using ammonium at a flow rate of about 19000 cc or greater.

In some embodiments, the second upper interlayer insulating layer 115b is formed using ammonium at a flow rate of about 14000 cc to 16000 cc, and the third upper interlayer insulating layer 115c is formed using ammonium at a flow rate of about 19000 cc or greater.

According to an embodiment, the sum of the second thickness t2 and the third thickness t3 is about 2000 Å. The second thickness t2 may be, for example, 300 Å to 2000 Å or less. When the second thickness t2 is 2000 Å, the third upper interlayer insulating layer 115c may be omitted.

As described above with reference to FIG. 13, according to an embodiment, when the thickness of the second upper interlayer insulating layer 115b is about 300 Å or greater, the threshold voltage Vth may be effectively increased.

Subsequently, according to an embodiment, contact holes CNT1 to CNT5 are formed in the upper interlayer insulating layer 115 (S50).

Subsequently, according to an embodiment, first source/drain electrodes 161 and 163 are formed (S60). When the first source/drain electrodes 161 and 163 are formed, a first connection electrode 162 and second source/drain electrodes 164 and 165 are formed together.

According to an embodiment, the first source/drain electrodes 161 and 163 include at least one metal selected from molybdenum (Mo), aluminum (Al), platinum (Pt), palladium (Pd), silver (Ag), magnesium (Mg), gold (Au), nickel (Ni), Neodymium (Nd), iridium (Ir), chromium (Cr), calcium (Ca), titanium (Ti), tantalum (Ta), tungsten (W), or copper (Cu). Each of the first source/drain electrodes 161 and 163 may be a single-layer film or a multi-layer film.

According to an embodiment, the first source/drain electrodes 161 and 163 are connected to the first source/drain regions of the oxide semiconductor layer 145 through the contact holes CNT1 and CNT2, respectively, that penetrate the upper interlayer insulating layer 115, and the second source/drain electrodes 164 and 165 are connected to the second source/drain regions of the polysilicon semiconductor layer 105 through the contact holes CNT4 and CNT5, respectively, that penetrate the upper interlayer insulating layer 115, the lower interlayer insulating layer 113, and the gate insulating layers 111 and 112.

According to an embodiment, the first connection electrode 163 is connected to the first upper gate electrode 151 through the third contact hole CNT3 that penetrates the upper interlayer insulating layer 115. The first connection electrode 163 is electrically connected to the first upper gate electrode 151 and lowers the resistance of the first upper gate electrode 151. The source/drain electrodes 161, 163, 164, and 165 and the first connection electrode 163 fill the contact holes CNT1 to CNT5, respectively.

In an embodiment, an annealing process is performed on the contact holes CNT1 to CNT5 between the step S50 of forming the contact holes CNT1 to CNT5 and the step S60 of forming the first source/drain electrodes 161 and 162.

According to an embodiment, after forming the first source/drain electrodes 161 and 163, a first via layer 116, a second connection electrode 171 on the first via layer 116, a second via layer 117 on the second connection electrode 171, an anode electrode 181 on the second via layer 117, a bank layer 118 on the anode electrode 181, a light emitting layer 182 on the anode electrode 181, a cathode electrode 183 on the light emitting layer 182, and an encapsulation layer 190 on the cathode electrode 183 are sequentially formed.

Hereinafter, display devices according to other embodiments will be described. In the following embodiments, the same components as those of embodiment already described may be referred to by the same reference numerals, and descriptions thereof are omitted or simplified.

Figure 22:
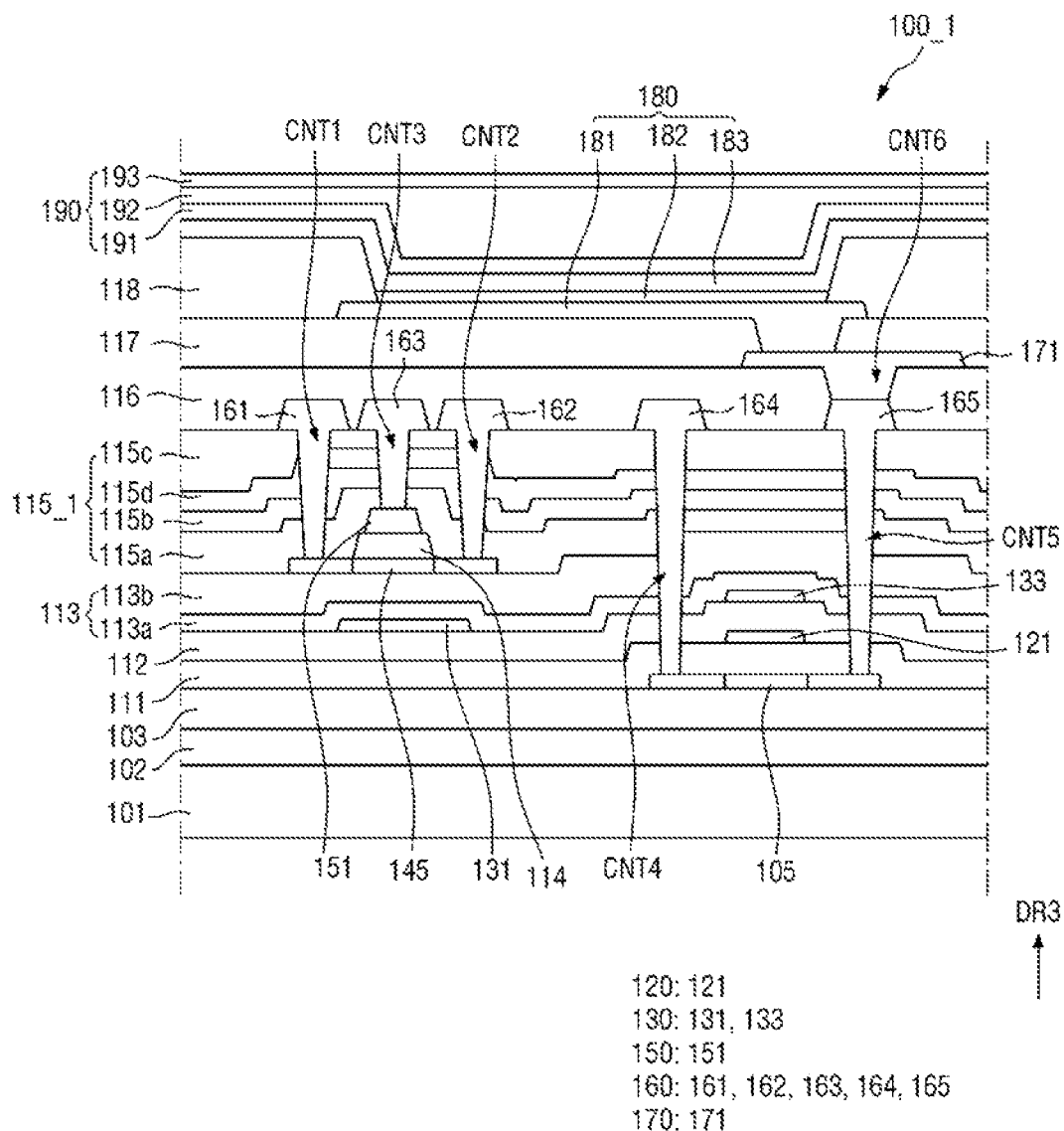
FIG. 22 is a cross-sectional view of a display panel according to another exemplary embodiment.

FIG. 22 is a cross-sectional view of a display panel according to another embodiment.

Referring to FIG. 22, a display panel 100_1 according to a present embodiment differs from the display panel 100 of FIG. 4 in that an upper interlayer insulating layer 115_1 further includes a fourth upper interlayer insulating layer 115d between the second upper interlayer insulating layer 115b and the third upper interlayer insulating layer 115c.

According to an embodiment, the fourth upper interlayer insulating layer 115d includes silicon nitride.

According to an embodiment, the hydrogen concentration in the fourth upper interlayer insulating layer 115d is less than the hydrogen concentration in the third upper interlayer insulating layer 115c.

In an embodiment, the hydrogen concentration in the fourth upper interlayer insulating layer 115d is greater than the hydrogen concentration in the second upper interlayer insulating layer 115b.

In an embodiment, for the fourth upper interlayer insulating layer 115d and the third upper interlayer insulating layer 115c to have hydrogen concentrations that differ from each other, the fourth upper interlayer insulating layer 115d and the third upper interlayer insulating layer 115c are formed using different ammonium flow rates when deposited by chemical vapor deposition.

For example, according to an embodiment, the fourth upper interlayer insulating layer 115d is formed using ammonium at a flow rate of greater than about 6000 cc and less than about 19000 cc.

In some embodiments, the hydrogen concentration in the fourth upper interlayer insulating layer 115d is less than the hydrogen concentration in the second upper interlayer insulating layer 115b.

For example, according to an embodiment, the fourth upper interlayer insulating layer 115d can be formed using ammonium at a flow rate of about 4000 cc to about 6000 cc, and the second upper interlayer insulating layer 115b can be formed using ammonium at a flow rate greater than about 6000 cc and less than about 19000 cc.

According to an embodiment, the upper interlayer insulating layer 115_1 further includes the fourth upper interlayer insulating layer 115d between the second upper interlayer insulating layer 115b and the third upper interlayer insulating layer 115c, thereby forming a stacked structure of the second upper interlayer insulating layer 115b and fourth upper interlayer insulating layer 115d that have hydrogen concentrations that differ from each other. Thus, it is possible to prevent the gradual penetration of hydrogen ions into the oxide semiconductor 145 in the thickness direction.

Figure 23:
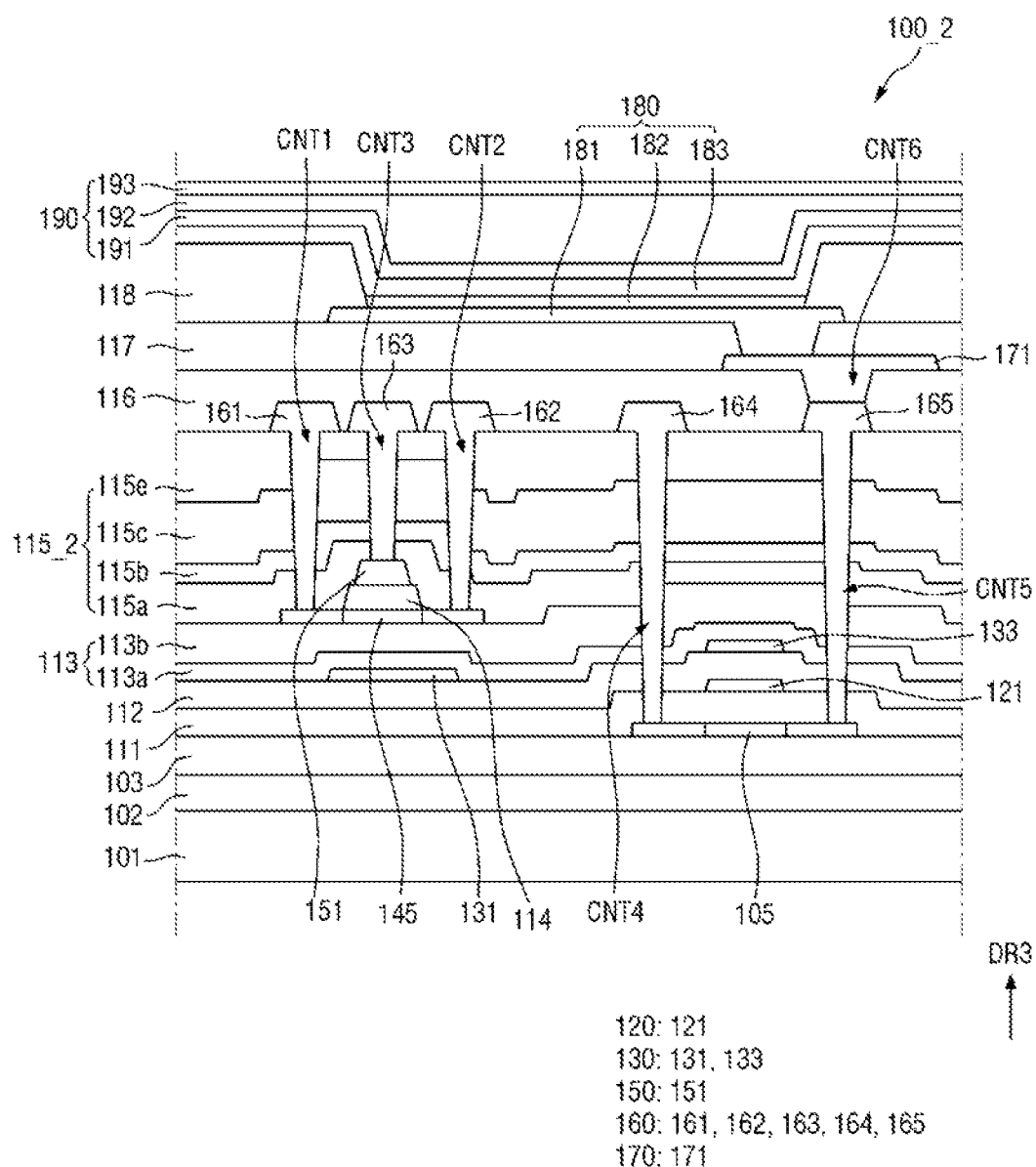
FIG. 23 is a cross-sectional view of a display panel according to another exemplary embodiment.

FIG. 23 is a cross-sectional view of a display panel according to another embodiment.

Referring to FIG. 23, a display panel 1002 according to a present embodiment differs from the display panel 100 of FIG. 4 in that an upper interlayer insulating layer 115_2 further includes a fourth upper interlayer insulating layer 115e between the third upper interlayer insulating layer 115c and the fourth conductive layer 160.

According to an embodiment, the hydrogen concentration in the fourth upper interlayer insulating layer 115e is less than the hydrogen concentration in the third upper interlayer insulating layer 115c.

According to an embodiment, the hydrogen concentration in the fourth upper interlayer insulating layer 115e is substantially the same as the hydrogen concentration in the second upper interlayer insulating layer 115b.

In some embodiments, the hydrogen concentration in the fourth upper interlayer insulating layer 115e is greater than the hydrogen concentration in the second upper interlayer insulating layer 115b, and is less than the hydrogen concentration in the third upper interlayer insulating layer 115c.

In some embodiments, the hydrogen concentration in the fourth upper interlayer insulating layer 115e is less than the hydrogen concentration in the second upper interlayer insulating layer 115b.

According to an embodiment, the upper interlayer insulating layer 115_1 further includes the fourth upper interlayer insulating layer 115e between the third upper interlayer insulating layer 115c and the fourth conductive layer 160, thereby effectively preventing hydrogen ions from penetrating from the upper portion of the upper interlayer insulating layer 115_2.

Figure 24:
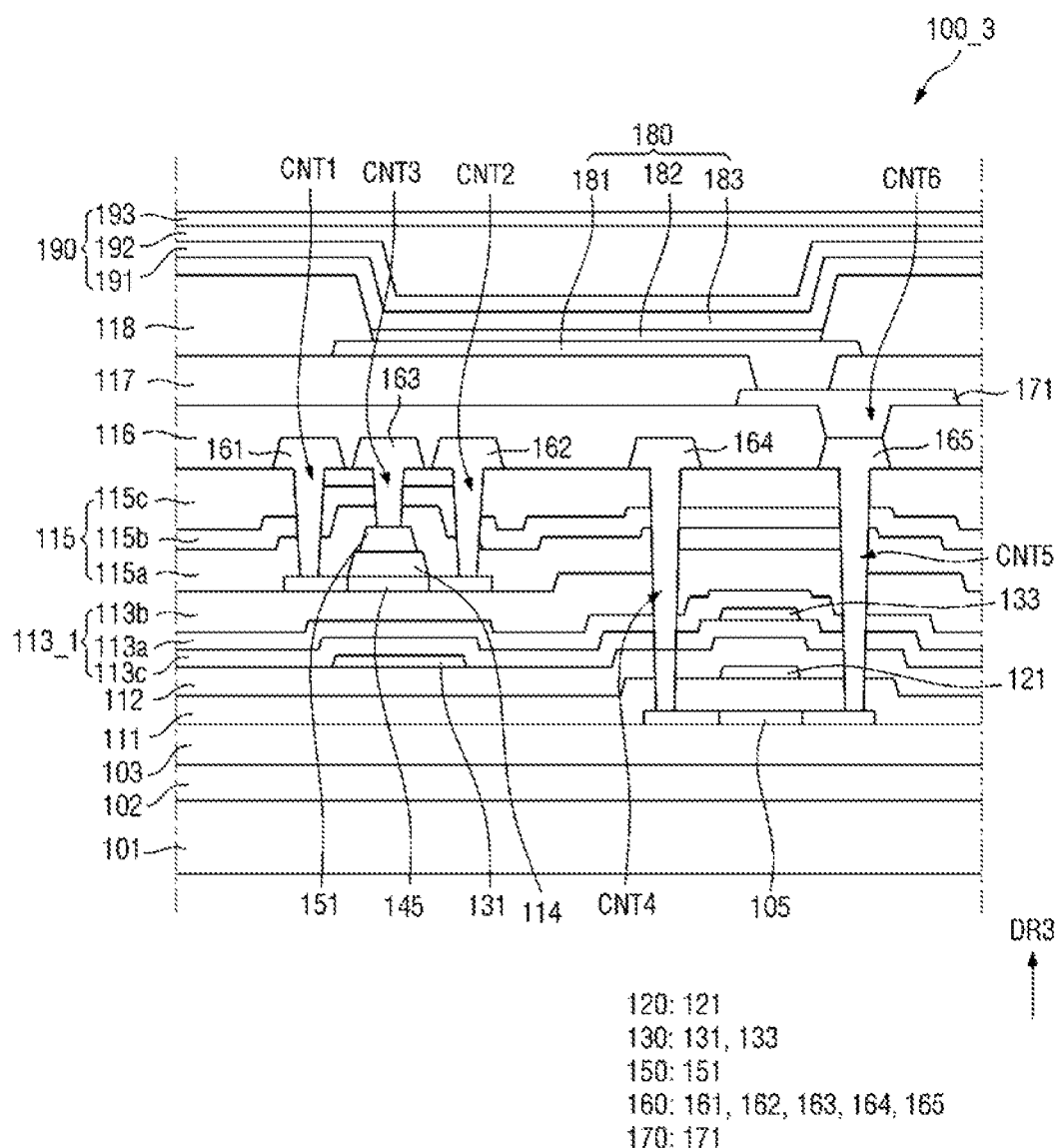
FIG. 24 is a cross-sectional view of a display panel according to another exemplary embodiment.

FIG. 24 is a cross-sectional view of a display panel according to another embodiment.

Referring to FIG. 24, a display panel 100_3 according to a present embodiment differs from the display panel 100 of FIG. 4 in that a lower interlayer insulating layer 113_1 further includes a third upper interlayer insulating layer 113c between the first lower interlayer insulating layer 113a and the upper gate insulating layer 112 and between the first lower interlayer insulating layer 113a and the first lower gate electrode 131.

In an embodiment, the hydrogen concentration in the third upper interlayer insulating layer 113c is less than the hydrogen concentration in the first lower interlayer insulating layer 113a.

In an embodiment, for the third upper interlayer insulating layer 113c and the first lower interlayer insulating layer 113a to have hydrogen concentrations that differ from each other, the third upper interlayer insulating layer 113c and the first lower interlayer insulating layer 113a are formed using different ammonium flow rates when deposited by chemical vapor deposition.

For example, according to an embodiment, the third upper interlayer insulating layer 113c is formed using ammonium at a flow rate of about 4000 cc to about 6000 cc, and the first lower interlayer insulating layer 113a is formed using ammonium at a flow rate of about 19000 cc or greater.

According to an embodiment, the lower interlayer insulating layer 113_1 further includes the third upper interlayer insulating layer 113c between the first lower interlayer insulating layer 113a and the upper gate insulating layer 112 and between the first lower interlayer insulating layer 113a and the first lower gate electrode 131, and the hydrogen concentration in the third lower interlayer insulating layer 113c is less than the hydrogen concentration in the first lower interlayer insulating layer 113a, thereby effectively preventing hydrogen ions from penetrating from the lower portion of the lower interlayer insulating layer 113_1.

Figure 25:
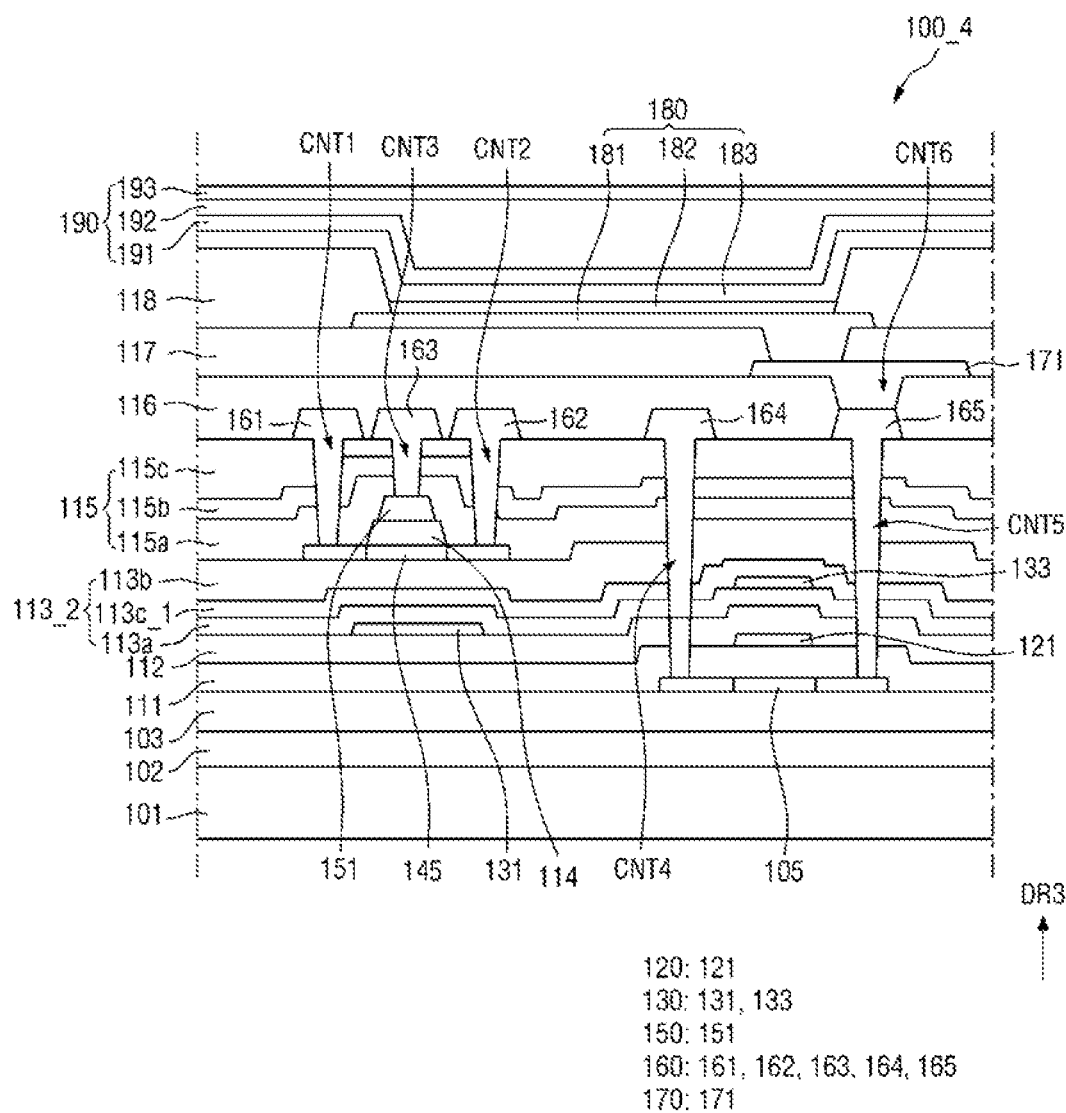
FIG. 25 is a cross-sectional view of a display panel according to another exemplary embodiment.

FIG. 25 is a cross-sectional view of a display panel according to another embodiment.

Referring to FIG. 25, a display panel 100_4 according to a present embodiment differs from the display panel 100 of FIG. 4 in that a lower interlayer insulating layer 113_2 further includes a third upper interlayer insulating layer 113c_1 between the first lower interlayer insulating layer 113a and the second lower interlayer insulating layer 113b.

In an embodiment, the hydrogen concentration in the third upper interlayer insulating layer 113c_1 is less than the hydrogen concentration in the first lower interlayer insulating layer 113a.

In an embodiment, for the third upper interlayer insulating layer 113c_1 and the first lower interlayer insulating layer 113a to have hydrogen concentrations that differ from each other, the third upper interlayer insulating layer 113c_1 and the first lower interlayer insulating layer 113a are formed using different ammonium flow rates when deposited by chemical vapor deposition.

For example, according to an embodiment, the third upper interlayer insulating layer 113c_1 is formed using ammonium at a flow rate of about 4000 cc to about 6000 cc, and the first lower interlayer insulating layer 113a is formed using ammonium at a flow rate of about 19000 cc or greater.

According to an embodiment, the lower interlayer insulating layer 113_2 further includes the third upper interlayer insulating layer 113c_1 between the first lower interlayer insulating layer 113a and the second lower interlayer insulating layer 113b, and the hydrogen concentration in the third lower interlayer insulating layer 113c_1 is less than the hydrogen concentration in the first lower interlayer insulating layer 113a, thereby effectively preventing hydrogen ions from penetrating from the lower portion of the lower interlayer insulating layer 113_2.

Figure 26:
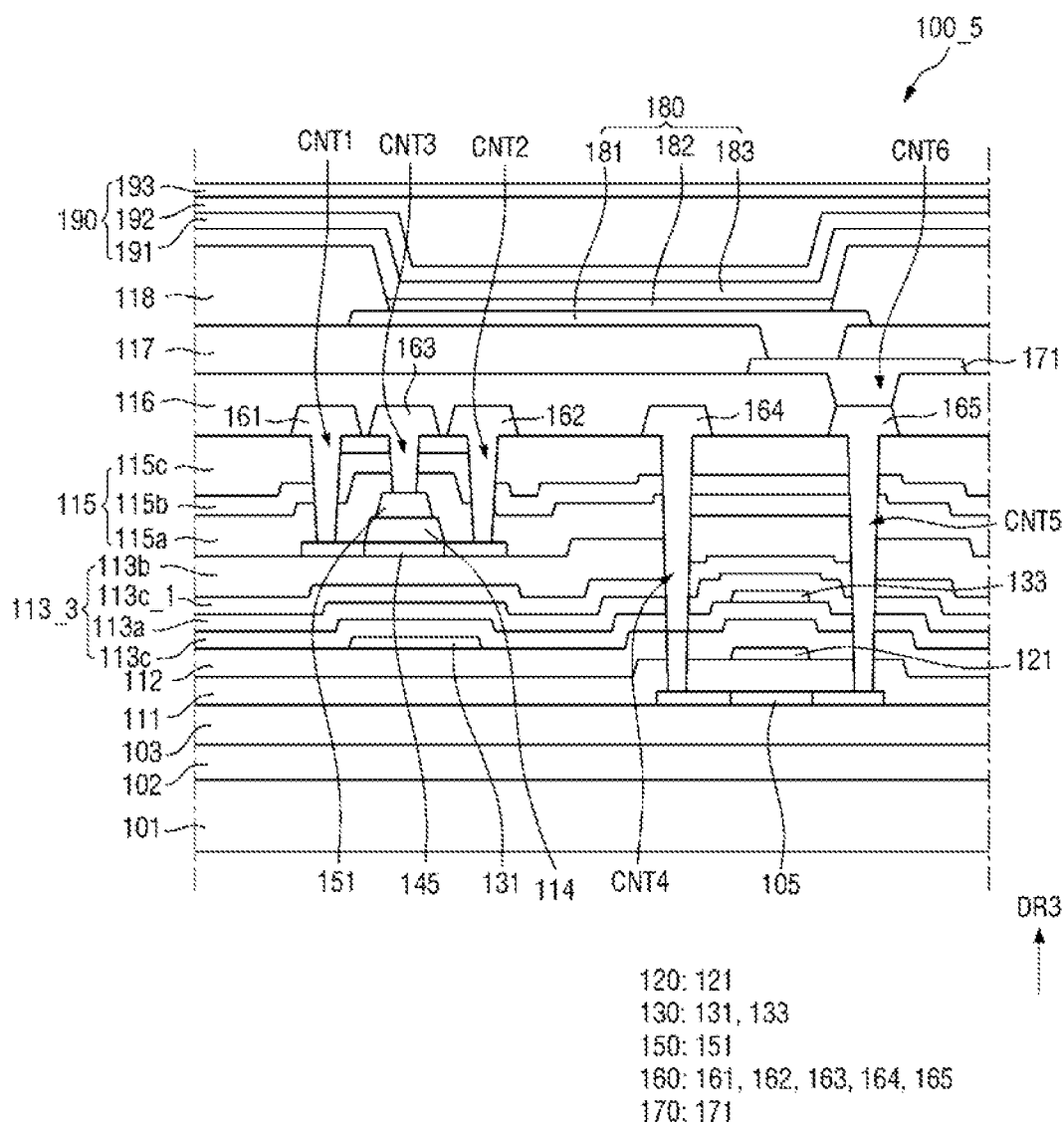
FIG. 26 is a cross-sectional view of a display panel according to another exemplary embodiment.

FIG. 26 is a cross-sectional view of a display panel according to another embodiment.

Referring to FIG. 26, a display panel 100_5 according to a present embodiment differs from the display panel 100 of FIG. 4 in that a lower interlayer insulating layer 113_3 includes both the third lower interlayer insulating layer 113c described with reference to FIG. 24 and the third lower interlayer insulating layer 113c_1 described with reference to FIG. 25.

Other descriptions have been presented above with reference to FIGS. 4, 24, and 25, and thus duplicate descriptions thereof will be omitted.

According to an embodiment, the lower interlayer insulating layer 113_3 includes both the third lower interlayer insulating layer 113c described with reference to FIG. 24 and the third lower interlayer insulating layer 113c_I described with reference to FIG. 25, thereby effectively preventing hydrogen ions from penetrating from the lower portion of the lower interlayer insulating layer 113_3.

According to a display device of an embodiment and a method of manufacturing the display device, device characteristics of thin film transistors can be improved.

The effects of embodiments of the present disclosure are not limited by the foregoing, and other various effects are anticipated herein.

Although exemplary embodiments of the present disclosure have been disclosed for illustrative purposes, those skilled in the art will appreciate that various modifications, additions and substitutions are possible, without departing from the scope and spirit of exemplary embodiments of the disclosure as disclosed in the accompanying claims.

What is claimed is:

1. A display device, comprising:
a base substrate;
an oxide semiconductor layer disposed on the base substrate and that includes a first channel region;
a first gate insulating layer disposed on the first channel region of the oxide semiconductor layer and that overlaps the first channel region of the oxide semiconductor layer;
a first upper gate electrode disposed on the first gate insulating layer and that overlaps the first gate insulating layer; and
an upper interlayer insulating layer disposed on the first upper gate electrode and that covers the first upper gate electrode, a side surface of the first gate insulating layer, and an upper surface of the oxide semiconductor layer, wherein the upper interlayer insulating layer includes
a first upper interlayer insulating layer disposed on the first upper gate electrode,
a second upper interlayer insulating layer disposed on the first upper interlayer insulating layer, and
a third upper interlayer insulating layer disposed on the second upper interlayer insulating layer,
the first upper interlayer insulating layer includes silicon oxide,
each of the second upper interlayer insulating layer and the third upper interlayer insulating layer includes silicon nitride, and
a hydrogen concentration in the second upper interlayer insulating layer is less than a hydrogen concentration in the third upper interlayer insulating layer.

2. The display device of claim 1, wherein the first upper interlayer insulating layer directly contacts the first upper gate electrode, the side surface of the first gate insulating layer, and the upper surface of the oxide semiconductor layer.

3. The display device of claim 1, wherein the second upper interlayer insulating, layer is disposed between the first upper interlayer insulating layer and the third upper interlayer insulating layer.

4. The display device of claim 3, wherein
the second upper interlayer insulating layer is disposed directly on the first upper interlayer insulating layer, and
the third upper interlayer insulating layer is disposed directly on the second upper interlayer insulating layer.

5. The display device of claim 4, wherein the hydrogen concentration in the second upper interlayer insulating layer is 1E+22 atoms/cm$^3$ or less.

6. The display device of claim 4, wherein the second upper interlayer insulating layer has a thickness from 300 Å to 2000 Å.

7. The display device of claim 6, wherein the first upper interlayer insulating layer has a thickness from 500 Å to 3000 Å.

8. The display device of claim 3, wherein
the upper interlayer insulating layer further includes a fourth upper interlayer insulating layer disposed between the second upper interlayer insulating layer and the third upper interlayer insulating layer,
the fourth upper interlayer insulating layer includes silicon nitride, and
the hydrogen concentration in the fourth upper interlayer insulating layer is between the hydrogen concentration in the second upper interlayer insulating layer and the hydrogen concentration in the third upper interlayer insulating layer.

9. The display device of claim 1, further comprising:
a first source electrode and a first drain electrode disposed on the upper interlayer insulating layer, wherein
the first source electrode is connected to the oxide semiconductor layer through a first contact hole that penetrates the upper interlayer insulating layer, and
the first drain electrode is connected to the oxide semiconductor layer through a second contact hole that penetrates the upper interlayer insulating layer.

10. The display device of claim 9, further comprising:
a first connection electrode disposed on the upper interlayer insulating layer,
wherein the first connection electrode is disposed on the same layer as the first source electrode, and
the first connection electrode is connected to the first upper gate electrode through a third contact hole that penetrates the upper interlayer insulating layer.

11. The display device of claim 9, further comprising:
a first lower gate electrode disposed between the base substrate and the oxide semiconductor layer; and
a lower interlayer insulating layer disposed between the first lower gate electrode and the oxide semiconductor layer,
wherein the first lower gate electrode overlaps the first upper gate electrode.

12. The display device of claim 11,
wherein the lower interlayer insulating layer includes
a first lower interlayer insulating layer that contacts the first lower gate electrode, and
a second lower interlayer insulating layer disposed between the first lower interlayer insulating layer and the oxide semiconductor layer,
wherein the first lower interlayer insulating layer includes silicon nitride, and the second lower interlayer insulating layer contains silicon oxide.

13. The display device of claim 12, further comprising:
a capacitor electrode disposed on the same layer as the first lower gate electrode and spaced apart from the first lower gate electrode;
an upper gate insulating layer disposed between the capacitor electrode and the base substrate; and
a second gate electrode disposed between the upper gate insulating layer and the base substrate, wherein the second gate electrode overlaps the capacitor electrode.

14. The display device of claim 13, further comprising:
a lower gate insulating layer disposed between the second gate electrode and the base substrate; and a polycrystalline silicon semiconductor layer disposed between the lower gate insulating layer and the base substrate, wherein the polycrystalline silicon semiconductor layer includes a second channel region that overlaps the second gate electrode.

15. The display device of claim 14, further comprising:
a second source electrode and a second drain electrode disposed on the same layer as the first source electrode, wherein the second source electrode is connected to the polycrystalline silicon semiconductor layer through a fourth contact hole that penetrates the upper interlayer insulating layer, the lower interlayer insulating layer, the upper gate insulating layer, and the lower gate insulating layer, and the second drain electrode is connected to the polycrystalline silicon semiconductor layer through a fifth contact hole that penetrates the upper interlayer insulating layer, the lower interlayer insulating layer, the upper gate insulating layer, and the lower gate insulating layer.

16. The display device of claim 15, wherein the polycrystalline silicon semiconductor layer, the second gate electrode, the capacitor electrode, the second source electrode, and the second drain electrode constitute a driving transistor.

17. The display device of claim 12 wherein
the lower interlayer insulating layer further includes a third lower interlayer insulating layer disposed between the first lower interlayer insulating layer and the first lower gate electrode, the third lower interlayer insulating layer includes silicon nitride, and the hydrogen concentration in the third lower interlayer insulating layer is less than the hydrogen concentration in the first lower interlayer insulating layer.

18. The display device of claim 12, wherein
the lower interlayer insulating layer further includes a third lower interlayer insulating layer disposed between the first lower interlayer insulating layer and the second lower interlayer insulating layer, the third lower interlayer insulating layer includes silicon nitride, and the hydrogen concentration in the third lower interlayer insulating layer is less than the hydrogen concentration in the first lower interlayer insulating layer.

19. The display device of claim 9, wherein
the upper interlayer insulating layer further includes a fourth upper interlayer insulating layer disposed between the third upper interlayer insulating layer and the first source electrode, and the hydrogen concentration in the fourth upper interlayer insulating layer is less than the hydrogen concentration in the third upper interlayer insulating layer.

20. A method of manufacturing a display device, comprising:
forming an oxide semiconductor layer on a base substrate, wherein the oxide semiconductor layer includes a first channel region, a first drain region located at one side of the first Channel region, and a first source region looted at the other side of the first channel region;

forming a first gate insulating layer on the first channel region of the oxide semiconductor layer, wherein the first gate insulating layer overlaps the first channel region of the oxide semiconductor layer and exposes upper surfaces of the first drain region and first source region of the oxide semiconductor layer;

forming a first upper gate electrode on the first gate insulating layer, wherein the first upper gate electrode overlaps the first gate insulating layer, and forming an upper interlayer insulating layer on the first upper gate electrode, wherein the upper interlayer insulating layer covers the first upper gate electrode, a side surface of the first gate insulating layer, and an upper surface of the oxide semiconductor layer exposed by the first source region and the first drain region, wherein forming the upper interlayer insulating layer includes:
forming a first upper interlayer insulating layer on the first upper gate electrode;
forming a second upper interlayer insulating layer on the first upper interlayer insulating layer; and
forming a third upper interlayer insulating layer on the second upper interlayer insulating layer, wherein the first upper interlayer insulating layer includes silicon oxide, each of the second upper interlayer insulating layer and the third upper interlayer insulating layer includes silicon nitride, and a hydrogen concentration in the second upper interlayer insulating layer is less than a hydrogen concentration in the third upper interlayer insulating layer.

21. The method of claim 20, further comprising:
forming a contact hole that penetrates the first upper interlayer insulating layer, the second upper interlayer insulating layer, and the third upper interlayer insulating layer, after forming the upper interlayer insulating layer.

22. The method of claim 21, further comprising performing an annealing process on the contact hole after forming the contact hole.

23. The method of claim 22, further comprising:
forming source/drain electrodes that fill the contact hole, after performing the annealing process on the contact hole.

24. A display device, comprising:
a base substrate;
a lower interlayer insulating, layer disposed on the base substrate;
a first lower gate electrode disposed between the base substrate and the lower interlayer insulating layer;
an oxide semiconductor layer disposed on the lower interlayer insulating layer;
a first gate insulating layer disposed the oxide semiconductor layer;
a first upper gate electrode disposed on the first gate insulating layer; and
an upper interlayer insulating layer disposed on the first upper gate electrode, wherein the lower interlayer insulating layer includes a first lower interlayer insulating layer and a second lower interlayer insulating layer, wherein the first lower interlayer insulating layer includes silicon nitride, and the second lower interlayer insulating layer contains silicon oxide, wherein the first lower interlayer insulating layer contacts the first lower gate electrode, and the second lower interlayer insulating layer is disposed between the first lower interlayer insulating layer and the oxide semiconductor layer, wherein the upper interlayer insulating layer includes a first upper interlayer insulating layer, a second upper interlayer insulating layer, and a third upper interlayer insulating layer, the first upper interlayer insulating layer includes silicon oxide, each of the second upper interlayer insulating layer and the third upper interlayer insulating layer includes silicon nitride, and a hydrogen concentration in the second upper interlayer insulating layer is less than a hydrogen concentration in the third upper interlayer insulating layer.

25. The display device of claim 24, further comprising:

wherein the first lower gate electrode overlaps the first upper gate electrode.

26. The display device of claim 25, wherein the first upper interlayer insulating layer is disposed on the first upper gate electrode, the second upper interlayer insulating layer is disposed on the first upper interlayer insulating layer, and the third upper interlayer insulating layer is disposed m the second upper interlayer insulating layer.

27. A display device, comprising:

a base substrate;

a lower interlayer insulating layer disposed on the base substrate;

an oxide semiconductor layer disposed on the lower interlayer insulating layer;

a first gate insulating layer disposed the oxide semiconductor layer;

a first upper gate electrode disposed on the first gate insulating layer; and an upper interlayer insulating layer disposed on the first upper gate electrode, wherein the lower interlayer insulating layer includes a first lower interlayer insulating layer and a second lower interlayer insulating layer, wherein the first lower interlayer insulating layer includes silicon nitride, and the second lower interlayer insulating layer contains silicon oxide, wherein the upper interlayer insulating layer includes a first upper interlayer insulating laver, a second upper interlayer insulating layer, and a third upper interlayer insulating laver, the first upper interlayer insulating layer includes silicon oxide, each of the second upper interlayer insulating layer and the third upper interlayer insulating layer includes silicon nitride, and a hydrogen concentration in the second upper interlayer insulating layer is less than a hydrogen concentration in the third upper interlayer insulating laver, wherein:

the oxide semiconductor layer includes a first channel region, a first drain region located at one side of the first channel region, and a first source region located at the other side of the first channel region;

the first gate insulating layer is disposed on the first channel region of the oxide semiconductor layer and overlaps the first channel region of the oxide semiconductor layer and exposes upper surfaces of the first drain region and first source region of the oxide semiconductor layer; and the upper interlayer insulating layer covers the first upper gate electrode, a side surface of the first gate insulating layer, and an upper surface of the oxide semiconductor layer exposed by the first source region and the first drain region.

* * * * *